(12) United States Patent
Itonaga

(10) Patent No.: US 8,035,714 B2
(45) Date of Patent: Oct. 11, 2011

(54) SOLID-STATE IMAGING DEVICE, METHOD OF MANUFACTURING THE SAME, AND CAMERA

(75) Inventor: Kazuichiro Itonaga, Tokyo (JP)

(73) Assignee: Sony Corporation, Tokyo (JP)

( * ) Notice: Subject to any disclaimer, the term of this patent is extended or adjusted under 35 U.S.C. 154(b) by 699 days.

(21) Appl. No.: 12/219,825

(22) Filed: Jul. 29, 2008

(65) Prior Publication Data

US 2009/0086066 A1    Apr. 2, 2009

(30) Foreign Application Priority Data

Sep. 28, 2007 (JP) .................................. 2007-256627

(51) Int. Cl.
*H04N 3/14*    (2006.01)
*H04N 5/335*    (2011.01)

(52) U.S. Cl. ........................................ 348/302; 348/308
(58) Field of Classification Search .................. 348/302, 348/308–310; 257/291–293
See application file for complete search history.

(56) References Cited

U.S. PATENT DOCUMENTS

2009/0014628 A1 * 1/2009 Sakano et al. ................. 257/292

FOREIGN PATENT DOCUMENTS

| JP | 10-116975 | 5/1998 |
| JP | 2006-032681 | 2/2006 |
| JP | 2007-081448 | 3/2007 |

\* cited by examiner

*Primary Examiner* — Ali Cia M Harrington
(74) *Attorney, Agent, or Firm* — Rader, Fishman & Grauer PLLC

(57) ABSTRACT

Disclosed is a solid-state imaging device includes for each pixel a photoelectric conversion unit, a charge accumulating portion, and a potential barrier provided between the photoelectric conversion unit and the charge accumulating portion, in a thickness direction of a substrate. When light is received, a first charge derived from one of electron-hole pairs generated by photoelectric conversion is accumulated in the photoelectric conversion unit as signal charge, and the potential barrier is modulated by a second charge derived from the other of the electron-hole pairs so that the first charge that has accumulated in the charge accumulating portion is supplied to the photoelectric conversion unit.

11 Claims, 21 Drawing Sheets

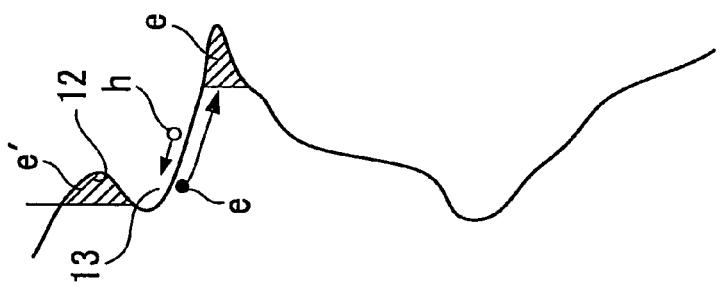
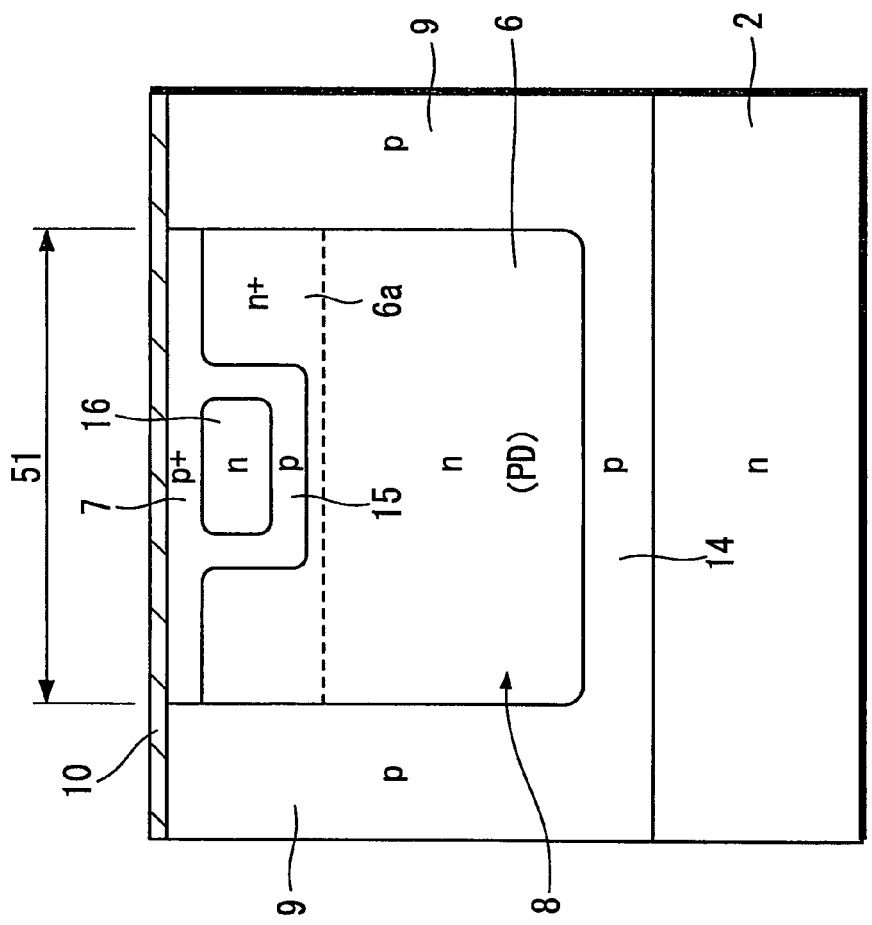

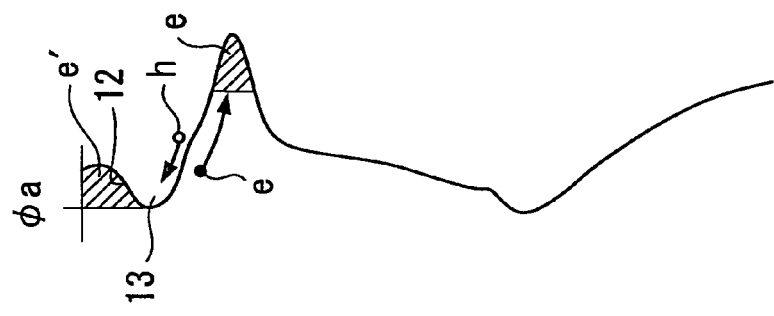
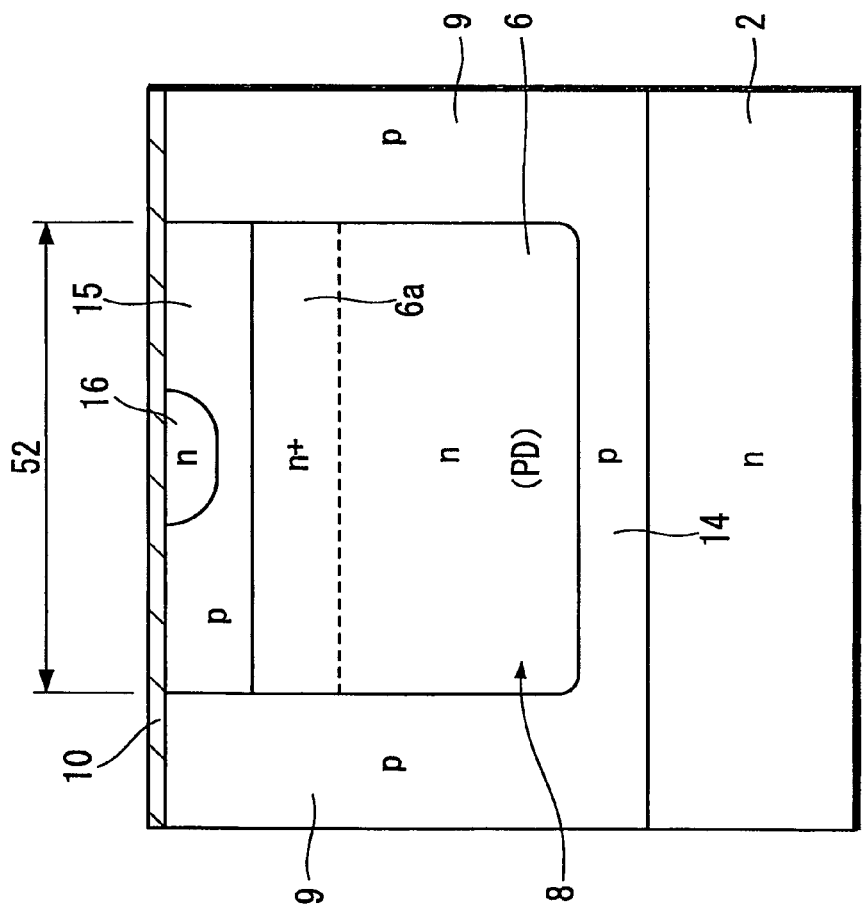

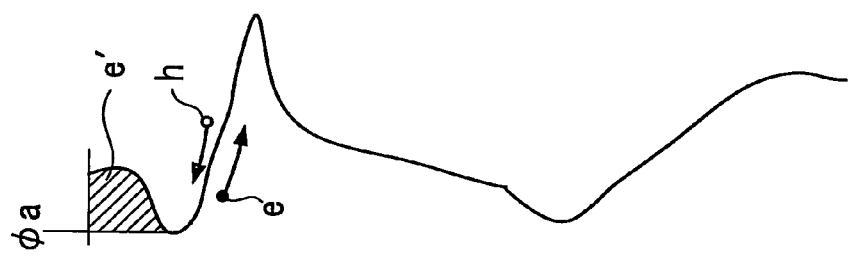
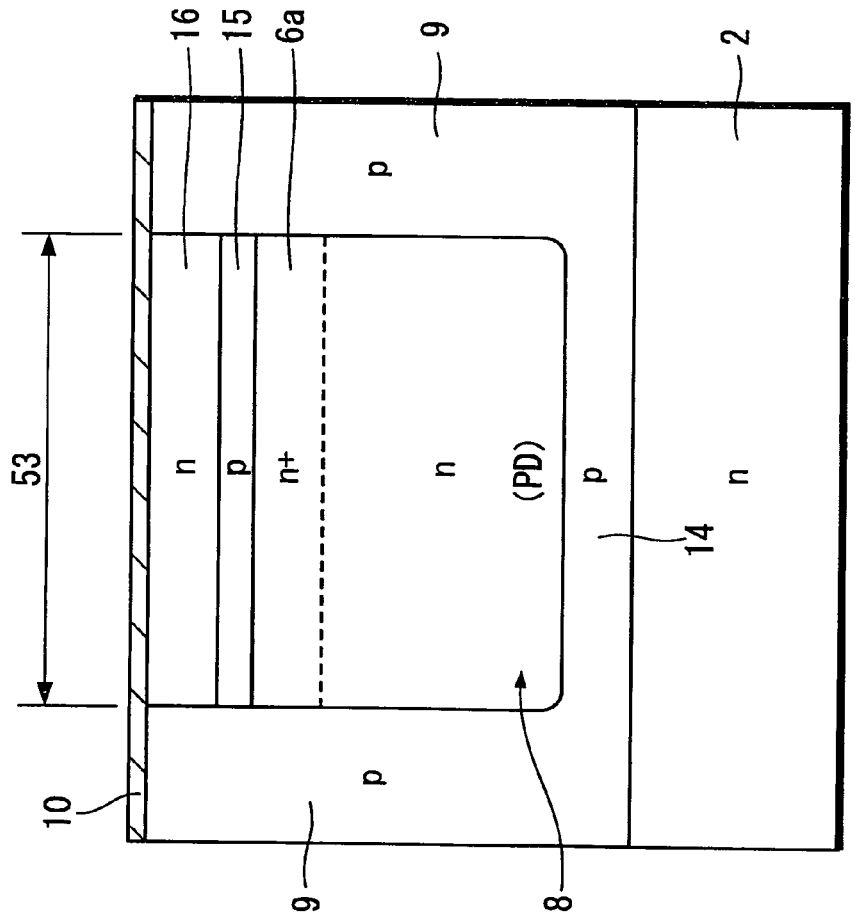

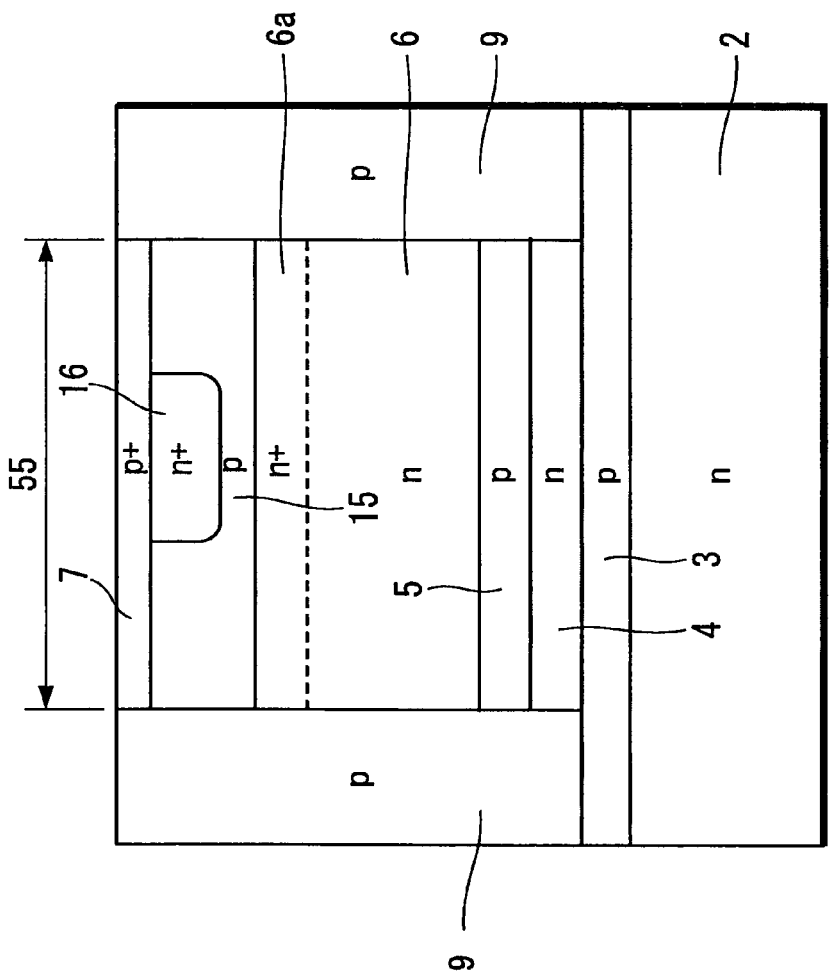
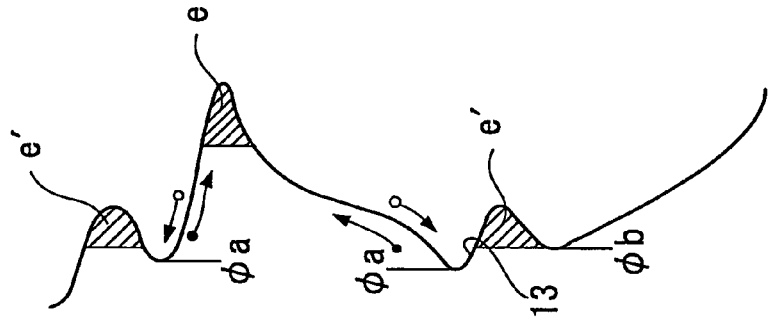

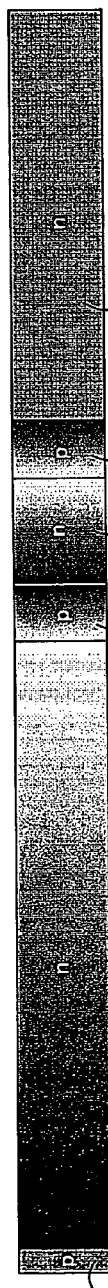
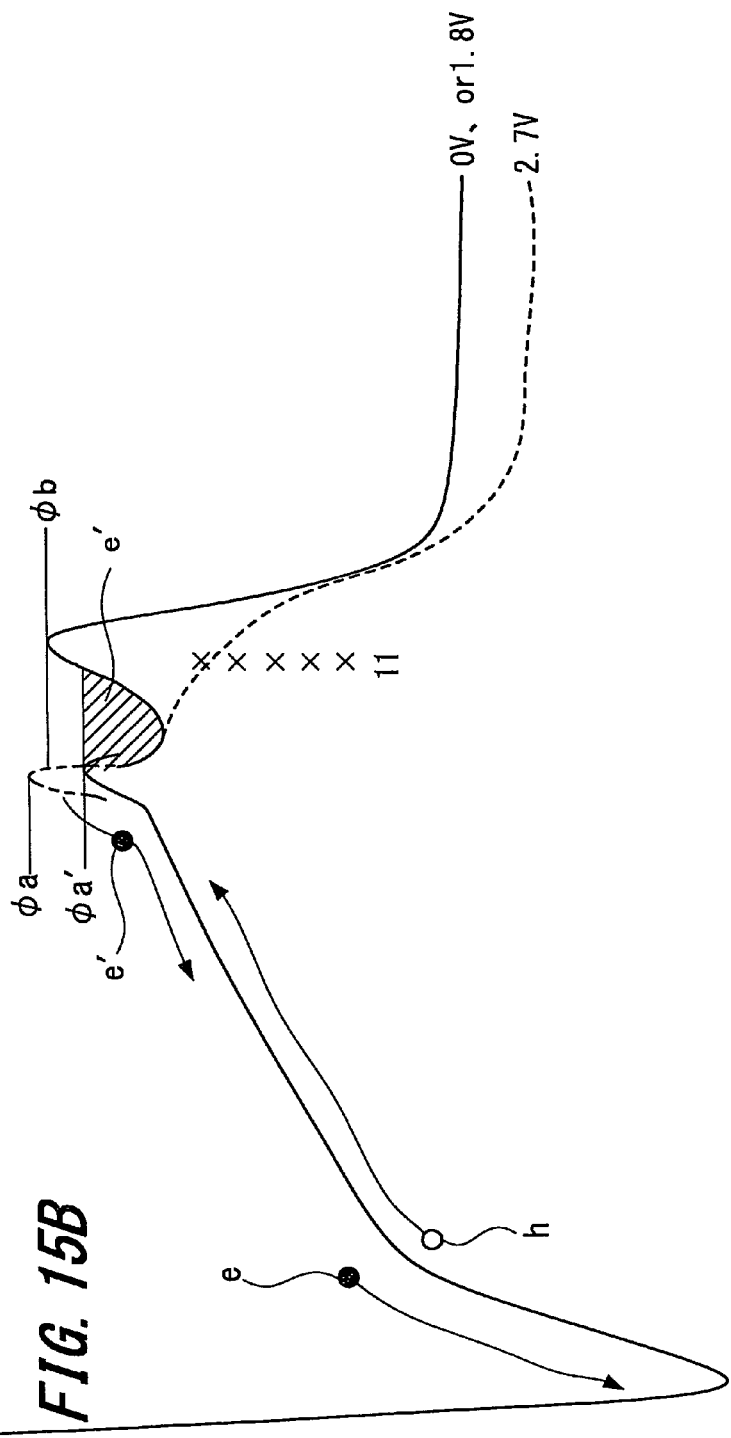
FIG. 15A
FIG. 15B

SOLID-STATE IMAGING DEVICE, METHOD OF MANUFACTURING THE SAME, AND CAMERA

CROSS REFERENCES TO RELATED APPLICATIONS

The present invention contains subject matter related to Japanese Patent Application JP 2007-256627 filed in the Japanese Patent Office on Sep. 28, 2007, the entire contents of which being incorporated herein by reference.

BACKGROUND OF THE INVENTION

1. Field of the Invention

The present invention relates to a solid-state imaging device such as a CMOS image sensor or a CCD image sensor, a method of manufacturing the same, and a camera having such solid-state imaging device.

2. Description of the Related Art

Solid-state imaging devices can be roughly classified into amplifying solid-state imaging devices as represented by CMOS image sensors and charge-transfer solid-state imaging devices as represented by CCD solid-state imaging devices. When CMOS image sensors and CCD image sensors are compared, a CCD image sensor usually consumes a high driving voltage to transfer signal charge and therefore has a high power supply voltage compared to a CMOS image sensor. Accordingly, a CMOS image sensor is often used as a solid-state imaging device provided in a mobile appliance such as a camera-equipped mobile telephone or a PDA (Personal Digital Assistant) due to the power supply voltage and the power consumption being lower than with a CCD image sensor.

Japanese Unexamined Patent Application Publication No. 2006-32681 discloses the configuration of a CMOS solid-state imaging device where the light receiving portion of a pixel includes a photodiode produced by forming a p+ type semiconductor layer on an n type semiconductor layer. Japanese Unexamined Patent Application Publication No. 2007-81448 discloses a CCD solid-state imaging device where a light receiving portion of a pixel includes a photodiode produced by forming a p+ type positive charge accumulating region on an n type impurity diffused region. The publication also discloses a technology that forms an overflow barrier by epitaxial growth and ion implantation. Japanese Unexamined Patent Application Publication No. H10-116975 discloses a method of manufacturing a super junction semiconductor element with a deep pn junction where an n-type epitaxial layer is formed and then the acceleration voltage for ion implantation is continuously changed using a photoresist mask to form a p-type semiconductor region in the n-type epitaxial layer.

SUMMARY OF THE INVENTION

However, in recent years, the pixels are made significantly smaller so that an area of each pixel also decreases in size for a solid-state imaging device. Accordingly, the light receiving area has decreased, resulting in degradation in sensitivity. In CMOS image sensors and CCD image sensors, one of the electron-hole pairs (normally electrons) generated by photoelectric conversion is used as signal charge. Thus, the amount of electrons obtained from a predetermined amount of incident light falls in accordance with the reduction in the light receiving area, resulting in degradation in sensitivity. This means that there is demand for the development of a solid-state imaging device where high sensitivity can be obtained even when pixels are made smaller.

Embodiments of the invention intend to provide a solid-state imaging device with improved sensitivity even when pixels are made smaller, and a method of manufacturing the same. The embodiments of the invention also provide a camera having such solid-state imaging device with improved sensitivity.

A solid-state imaging device according to an embodiment of the invention includes for each pixel a photoelectric conversion unit, a charge accumulating portion, and a potential barrier provided between the photoelectric conversion unit and the charge accumulating portion. When light is received, a first charge derived from one of electron-hole pairs generated by photoelectric conversion is accumulated in the photoelectric conversion unit as signal charge, and the potential barrier is modulated by a second charge derived from the other of the electron-hole pairs so that the first charge that has accumulated in the charge accumulating portion is supplied to the photoelectric conversion unit.

In the solid-state imaging device according to the embodiment, the first charge derived from one of the electron-hole pairs generated by photoelectric conversion when light is received is accumulated in the photoelectric conversion unit as signal charge. At the same time, the potential barrier between the photoelectric conversion unit and the charge accumulating portion is modulated by the second charge derived from the electron-hole pairs so that the first charge that has accumulated in the charge accumulating portion skips over the potential barrier and is supplied to the photoelectric conversion unit. Accordingly, the amount of signal charge that accumulates in the photoelectric conversion unit when light is received is the sum of the first charge generated by the photoelectric conversion and the first type of charge supplied from the charge accumulating portion based on the second charge.

A method of manufacturing a solid-state imaging device according to the embodiment includes the steps of implanting first ions of predetermined dopants into a surface of a semiconductor region before epitaxial growth, accumulating an epitaxial growth layer on the surface of the semiconductor region and diffusing the predetermined dopants in the epitaxial growth layer, and implanting second ions of predetermined dopants from a surface of the epitaxial growth layer. According to this method, pixel separating portions, a photoelectric conversion unit, a charge accumulating portion, and a potential barrier layer between the photoelectric conversion unit and the charge accumulating portion are formed.

The method of manufacturing a solid-state imaging device according to the present embodiment includes implanting predetermined dopants into the surface of a semiconductor surface before epitaxial growth, epitaxial growth is carried out, and then after epitaxial growth, ions of the predetermined dopants are implanted from the upper surface. This means that it can be possible to accurately form a multilayer structure with a small area where n-type semiconductor layers and p-type semiconductor layers are stacked one on top of the other in the depth direction of a substrate.

A camera according to the embodiment includes a solid-state imaging device, an optical system that guides incident light to an imaging unit of the solid-state imaging device, and a signal processing circuit that processes an output signal of the solid-state imaging device. The solid-state imaging device includes for every pixel a photoelectric conversion unit, a charge accumulating portion; and a potential barrier between the photoelectric conversion unit and the charge accumulating portion. When light is received, a first charge derived from one of electron-hole pairs generated by photoelectric conversion is accumulated in the photoelectric conversion unit as signal charge, and the potential barrier is modulated by a second charge derived from one of the electron-hole pairs so that the first charge that has accumulated in the charge accumulating portion is supplied to the photoelectric conversion unit.

According to the solid-state imaging device of the present embodiment, out of electron-hole pairs generated by photoelectric conversion, by having the other charge not used as signal charge also utilized to the supplying of signal charge, it can be possible to improve the sensitivity even when pixels are made smaller. According to the method of manufacturing a solid-state imaging device of the present embodiment, it can be possible to accurately manufacture the high-sensitivity solid-state imaging device described above. According to the camera of the present embodiment, it can be possible to provide a camera with high sensitivity even when the pixel area is reduced in size.

BRIEF DESCRIPTION OF THE DRAWINGS

FIGS. 7A and 7B are schematic diagrams showing a second embodiment of a light receiving region of a pixel of a solid-state imaging device according to the embodiment and a potential distribution thereof;

FIGS. 8A and 8B are schematic diagrams showing a third embodiment of a light receiving region of a pixel of a solid-state imaging device according to the embodiment and a potential distribution thereof;

FIGS. 12A and 12B are schematic diagrams showing a sixth embodiment of a light receiving region of a pixel of a solid-state imaging device according to the embodiment and a potential distribution thereof;

FIGS. 14A and 14B are schematic diagrams showing an eighth embodiment of a light receiving region of a pixel of a solid-state imaging device according to the embodiment;

FIGS. 15A and 15B are schematic diagrams showing a potential distribution of another embodiment of a light receiving region of a pixel of a solid-state imaging device according to the embodiment;

DESCRIPTION OF THE PREFERRED EMBODIMENTS

Preferred embodiments of the present invention will now be described with reference to the attached drawings.

A normal solid-state imaging device is formed so that a first charge derived from one of the electron-hole pairs generated by photoelectric conversion, such as only the electrons or only the holes, is treated as signal charge and a second charge derived from the other of the electron-hole pairs, is discharged from the photoelectric converting portion. The embodiments of the invention attempts to focus on the second charge that is discharged and not used as signal charge, and to use the second charge derived from the other of the electron-hole pairs generated by photoelectric conversion, so as to increase the signal charge at the photoelectric conversion unit.

Figure 1A:
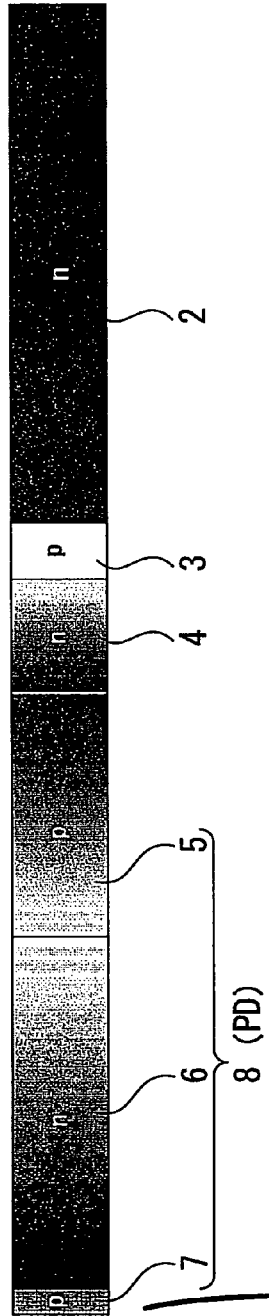
FIGS. 1A and 1B are a schematic diagram of a potential distribution of an embodiment of a light receiving region of a pixel of a solid-state imaging device according to an embodiment of the invention, and a potential distribution thereof.
Figure 1B:
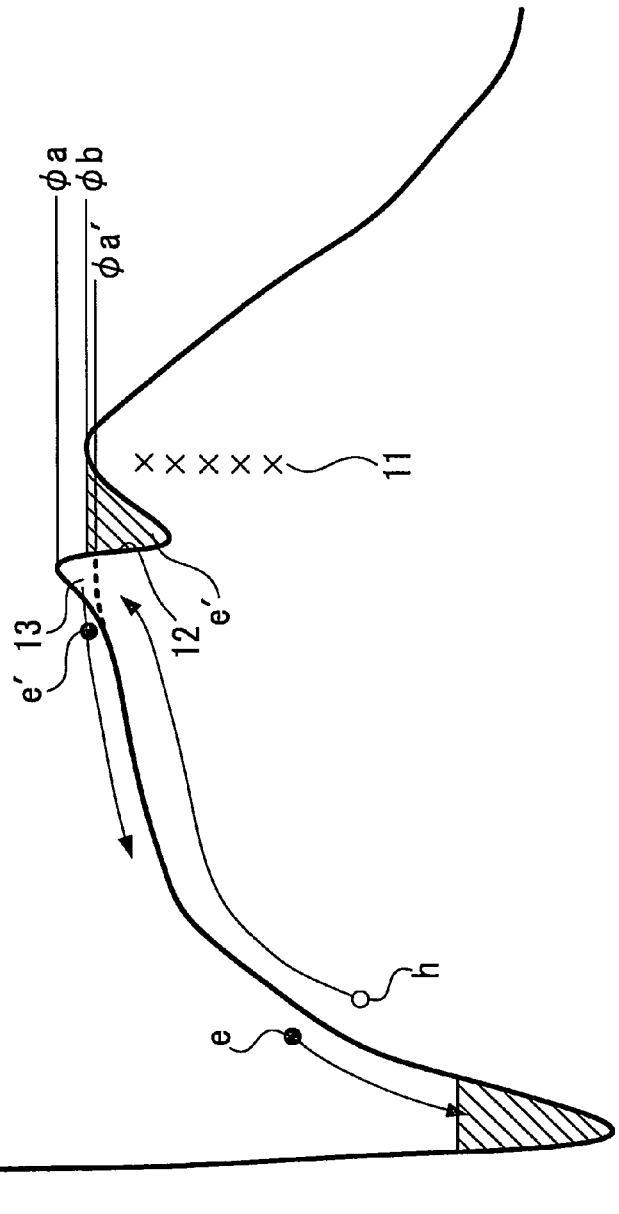
Figure 2:
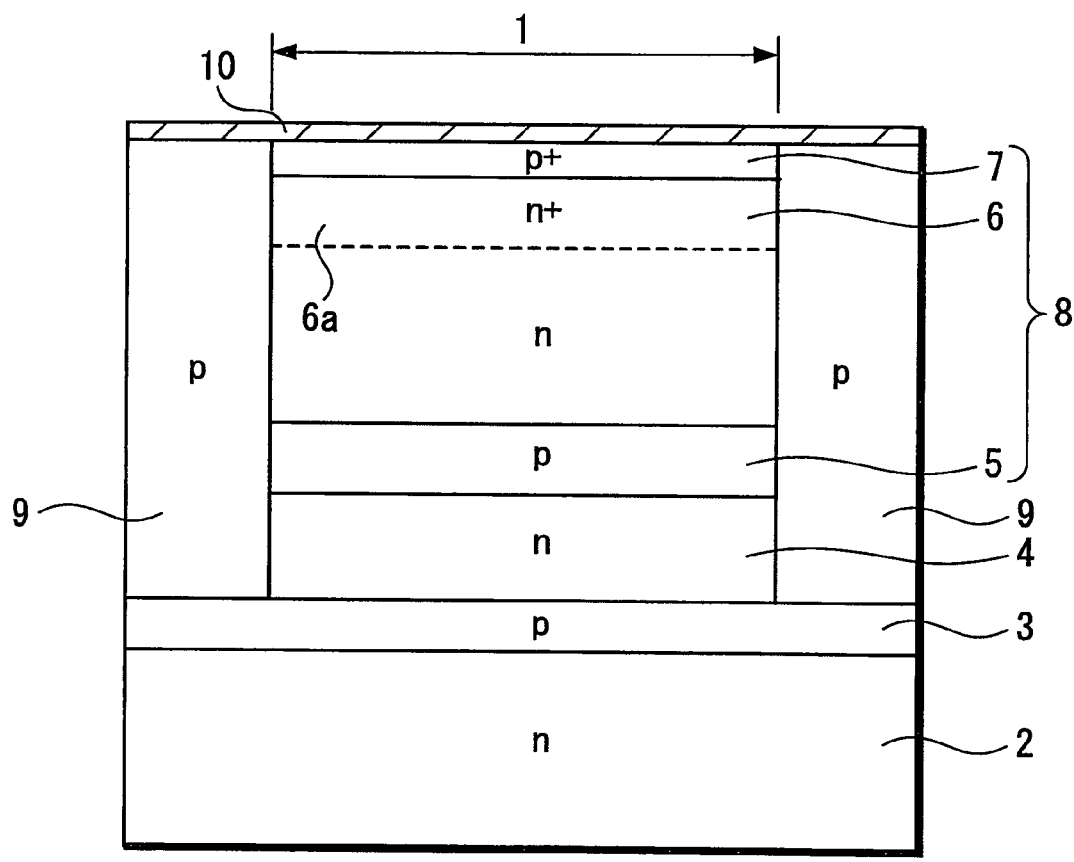
FIG. 2 is a schematic diagram showing a first embodiment of a light receiving region of a pixel of a solid-state imaging device according to the embodiment.

FIGS. 1A, 1B, and 2 show an embodiment of a light receiving region 1 including a photoelectric conversion unit of a solid-state imaging device. FIG. 1B is a schematic diagram of a potential distribution of the light-receiving region and FIG. 2 schematically shows the cross-sectional configuration of a light receiving region including a photoelectric conversion unit. This is an example of a case where electrons of the electron-hole pairs generated by photoelectric conversion are used as signal charge.

As shown in FIG. 1A and FIG. 2, a light receiving region 1 according to the present embodiment is formed of a second conduction-type (in the present embodiment, p-type) semiconductor layer 3, an n-type semiconductor layer 4, a p-type semiconductor layer 5, an n-type semiconductor layer 6, and a p-type semiconductor layer (a so-called "p+ accumulation layer") 7 in order on a first conduction-type (in the present embodiment, n-type) semiconductor substrate (for example, a silicon substrate) 2. Each light receiving region 1 that forms a pixel includes a region partitioned by pixel separating regions 9 (in the present embodiment, p-type semiconductor regions) formed on the semiconductor substrate 2. An insulating film 10 is formed of a silicon oxide film or the like over the entire surface that includes the light receiving regions 1.

Aside from the example described above, pixel separating regions that use STI (Shallow Trench Isolation), pixel separating regions that use LOCOS (LOCal Oxidation of Silicon), pixel separating regions that use EDI (Electro De-Ionization) where a p-doped layer is implanted into a silicon substrate and a thick oxide film is accumulated thereupon, or the like may be used as the pixel separating regions. Such pixel separating regions can be used in the same way in all of the embodiments described below. Note that for the respective semiconductor layers shown in FIG. 1A, the darker the color of the region, the higher the impurity concentration.

A photodiode PD substantially indicating a photoelectric conversion unit 8 with an HAD (Hole Accumulation Diode) configuration includes the p-type semiconductor layer 7 at the surface of the light receiving region 1 where light is incident, the n-type semiconductor layer 6 located below the p-type semiconductor layer 7, and the p-type semiconductor layer 5 located below the n-type semiconductor layer 6. The n-type semiconductor layer 4 formed deep in the substrate is used as a charge accumulating portion in which electrons (charge) are accumulated (hereinafter, the n-type semiconductor layer 4 is referred to as the "charge accumulating portion"). The p-type semiconductor layer 5 that contacts the light-incident side (that is, the substrate surface side in the present embodiment) of the charge accumulating portion 4 is utilized as a modulated potential barrier layer that forms a potential barrier $\phi a$ that is modulated by holes of the electron-hole pairs generated by the photoelectric conversion described later (hereinafter, this potential barrier $\phi a$ is referred to as the "modulated potential barrier $\phi a$"). The p-type semiconductor layer 3 that contacts the opposite side of the charge accumulating portion 4 to the light-incident side, that is, the "substrate depth side" of the charge accumulating portion 4 in the present embodiment is utilized as a substrate-side potential barrier layer with a fixed potential barrier $\phi b$ (hereinafter, the potential barrier $\phi b$ is referred to as the "substrate-side potential barrier $\phi b$").

Here, in a state just before light is received, the modulated potential barrier $\phi a$ is set higher than the substrate-side potential barrier $\phi b$. In the state where light is received and photoelectric conversion is carried out, the modulated potential barrier $\phi a$ is modulated by the holes h and set so as to become lower than the substrate-side potential barrier $\phi b$. The respective potentials of the charge accumulating portion 4, the p-type semiconductor layer 5 that forms the modulated potential barrier $\phi a$, and the p-type semiconductor layer 3 that forms the substrate-side potential barrier $\phi b$ can be set by varying the concentrations of the impurities implanted therein.

The charge accumulating portion 4 and the p-type semiconductor layer 5 that forms the modulated potential barrier $\phi a$ are separately formed for each pixel. The p-type semiconductor layer 3 that forms the substrate-side potential barrier $\phi b$ that is fixed is formed so as to be shared by each pixel.

On the other hand, faults 11 formed for generating electrons should preferably be formed deep in the substrate 2; that is, in a region in the vicinity of the charge accumulating portion 4 and the p-type semiconductor layer 3 for example. The electrons generated by forming such faults 11 are constantly accumulated in the charge accumulating portion 4. The faults 11 can be formed by distributing nitrogen, for example. The faults 11 in the present embodiment are formed so as to generate electrons of the electron-hole pairs, and accumulate the electrons in the charge accumulating portion 4.

Note that even if the faults 11 are not formed, it may still be possible for the charge accumulating portion 4 to accumulate electrons generated by photoelectric conversion of light with a long wavelength when light is received in a region in the vicinity of the charge accumulating portion 4 and the p-type semiconductor layer 3. It may also be possible to have the charge accumulating portion 4 accumulate thermal electrons that are generated by heat.

A voltage of 0V is applied to the p-type pixel separating regions 9 and to the p-type semiconductor layer 7 that forms an accumulation layer of the photoelectric conversion unit 8. The p-type semiconductor layer 5 that forms the modulated potential barrier layer is suppressed by applying the 0V, but the modulated potential barrier $\phi a$ is modulated by accumulating holes. To fix the substrate-side potential barrier $\phi b$ more stably, it is preferable for a certain potential to be applied to the n-type semiconductor substrate 2. As one example, 0V may be applied to the n-type semiconductor substrate 2.

Next, the operation of the light receiving region 1 of the present embodiment described above will be described. The electrons generated from the faults 11, or the electrons of the electron-hole pairs generated by photoelectron conversion due to light of a long wavelength being incident, or thermal electrons generated in the substrate (in the present embodiment, electrons e' generated from the faults 11 provided deep in the substrate) are accumulated in the potential dip (a potential dip for electrons) 12 of the charge accumulating portion 4. The potential dip 12 is constantly filled with the electrons e'. The electrons e' that overflow from the charge accumulating portion 4 skip over the substrate-side potential barrier $\phi b$ and are discharged toward the substrate 2.

When light is received, the electrons e of the electron-hole pairs, which are generated by photoelectric conversion by the photodiode PD used as the photoelectric conversion unit 8, are used as the signal charge and accumulated in a charge accumulating region 6a where the impurity concentration on the substrate surface side of the n-type semiconductor layer 6 is high. At the same time, the holes h of the electron-hole pairs generated by photoelectric conversion are accumulated in a potential dip (a potential dip for holes) 13, thereby modulating the modulated potential barrier $\phi a$. That is, the modulated potential barrier $\phi a$ becomes lower, as shown by the broken line in FIG. 1B.

This means that of the electrons e' accumulated in the charge accumulating portion 4, the electrons e' corresponding to the difference between the modulated potential barrier $\phi a$ and the fixed substrate-side potential barrier $\phi b$ skip over the modulated potential barrier $\phi a$ and are supplied to the n-type charge accumulating region 6a of the photodiode PD that is the photoelectric conversion unit 8. In this manner, an amount of signal charge (i.e., an amount of electrons) obtained by adding some of the electrons e' that have accumulated in the charge accumulating portion 4 to the electrons e of the electron-hole pairs generated by photoelectric conversion accumulates in the photoelectric conversion unit 8.

According to the solid-state imaging device of the present embodiment described above, the electrons e of the electron-hole pairs generated by photoelectric conversion are treated as signal charge, the modulated potential barrier $\phi a$ is modulated using the holes h, and the electrons e' accumulated in the charge accumulating portion 4 are supplied to the photoelectric conversion unit 8. Accordingly, by adding the electrons e that are the original signal charge and the electrons e' supplied from the charge accumulating portion 4 by the holes h in the photoelectric conversion unit 8, it may be possible to improve the sensitivity even when the light-receiving area is reduced due to the pixel area being made smaller.

Figure 3:
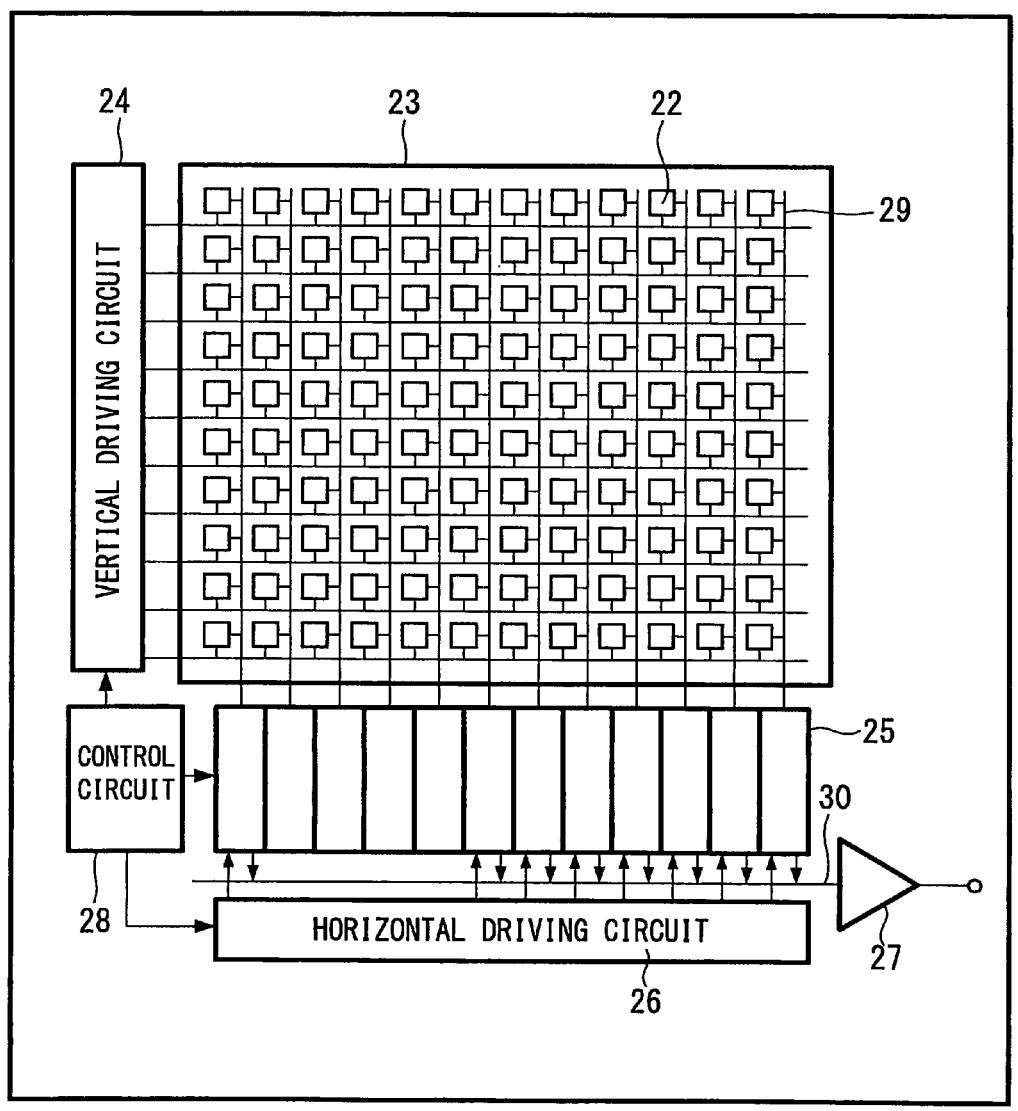
FIG. 3 is a schematic diagram showing an embodiment of a CMOS solid-state imaging device to which the present invention has been applied.

Next, an embodiment where solid-state imaging device is applied to a CMOS solid-state imaging device (or "image sensor") will be described. FIG. 3 shows the overall configuration of an embodiment of a CMOS solid-state imaging device. The solid-state imaging device 21 according to the present embodiment includes an imaging region 23 where pixels 22 that include a plurality of photoelectric conversion units are regularly arranged in a two-dimensional array, a vertical driving circuit 24 as a peripheral circuit thereof, column signal processing circuits 25, a horizontal driving circuit 26, an output circuit 27, a control circuit 28, and the like on a semiconductor substrate, for example, a silicon substrate.

The vertical driving circuit 24 is formed of a shift register, for example, selectively scans the respective pixels 22 in the imaging region 23 in units of rows in order in the vertical direction, and supplies the column signal processing circuits 25 via vertical signal lines 29 with pixel signals based on the signal charge generated in accordance with the amount of light received by the photoelectric conversion unit (i.e., the photodiode) in each pixel 22.

A column signal processing circuit 25 is disposed for each column of pixels 22, for example. As one example, each column signal processing circuit 25 is formed of an S/H (sample/hold) circuit, a CDS (Correlated Double Sampling) circuit, and the like. The column signal processing circuits 25 carry out signal processing such as noise reduction and signal amplification on signals outputted from the pixels 22 on one row based on signals from black reference pixels (although not shown, such pixels are formed in the periphery of the effective pixel region) for each pixel column. At the output stage of the column signal processing circuits 25, horizontal selection switches (not shown) are provided between the column signal processing circuits 25 and a horizontal signal line 30.

The horizontal driving circuit 26 is formed of a shift register, for example, and by successively outputting horizontal scan pulses, selects the respective column signal processing circuits 25 in order to have pixel signals outputted from the respective column signal processing circuits 25 to the horizontal signal line 30.

The output circuit 27 carries out signal processing on signals that are successively supplied via the horizontal signal line 30 from the respective column signal processing circuits 25 and outputs the processed signals.

The control circuit 28 generates control signals and a clock signal used as a reference for operations by the vertical driving circuit 24, the column signal processing circuits 25, the horizontal driving circuit 26, and the like based on a vertical synchronization signal, a horizontal synchronization signal, and a master clock, and inputs the signals into the vertical driving circuit 24, the column signal processing circuits 25, the horizontal driving circuit 26, and the like.

Figure 4:
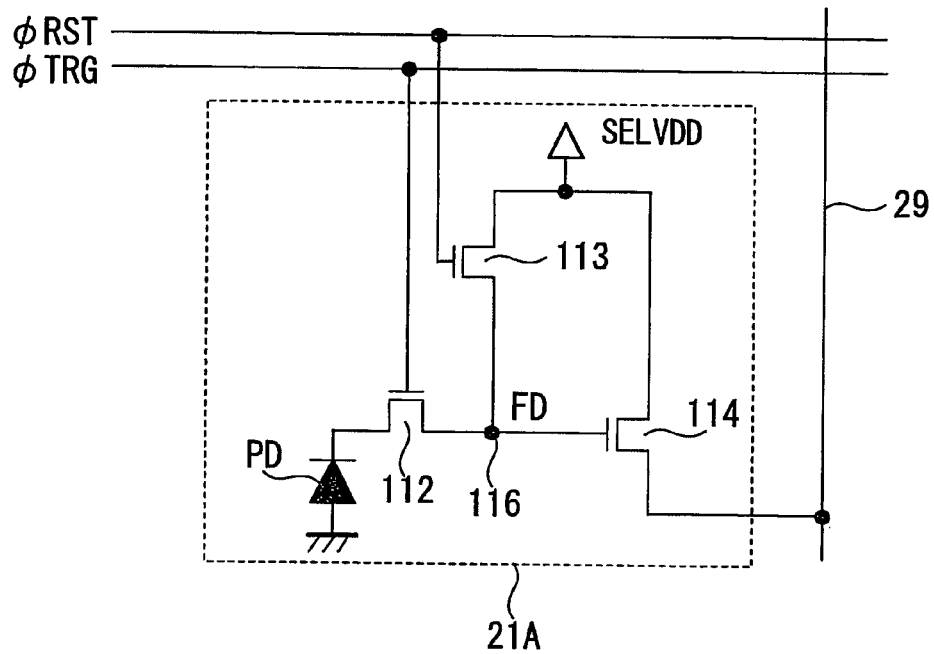
FIG. 4 is an equivalent circuit diagram showing one example of a single pixel according to a second embodiment of the present invention.

FIG. 4 is a circuit diagram showing one example of the circuit configuration of a single pixel 22. The pixel 22A according to this example circuit is formed so as to include a photoelectric conversion unit, such as a photodiode PD, and three pixel transistors. As one example, the three pixel transistors are a transfer transistor 112, a reset transistor 113, and an amplification transistor 114. As one example, n-channel MOS transistors may be used as the three pixel transistors 112 to 114.

The transfer transistor 112 is connected between the cathode of the photodiode PD and an FD (floating diffusion) unit 116. When photoelectric conversion is carried out by the photodiode PD, the signal charge (i.e., electrons) accumulated here can be transferred to the FD unit 116 by providing a transfer pulse φTRG to the gate of the transfer transistor 112.

The reset transistor 113 has a selective power supply SELVDD connected to the drain and the FD unit 116 connected to the source, and before the signal charge is transferred from the photodiode PD to the FD unit 116, the potential of the FD unit 116 can be reset by providing a reset pulse φRST to the gate of the reset transistor 113. The selective power supply SELVDD is a power supply that selectively sets the power supply voltage at a VDD level and a GND level.

The amplification transistor 114 has a source follower configuration where the FD unit 116 is connected to the gate, the selective power supply SELVDD is connected to the drain and the vertical signal line 29 is connected to the source. The amplification transistor 114 is switched to an operating state when the selective power supply SELVDD becomes the VDD level to select the pixel 22A, and the potential of the FD unit 116 after resetting by the reset transistor 113 is outputted to the vertical signal line 29 as the reset level. In addition, the amplification transistor 114 outputs the potential of the FD unit 116 after the transfer of signal charge by the transfer transistor 112 to the vertical signal line 29 as the signal level.

Figure 5:
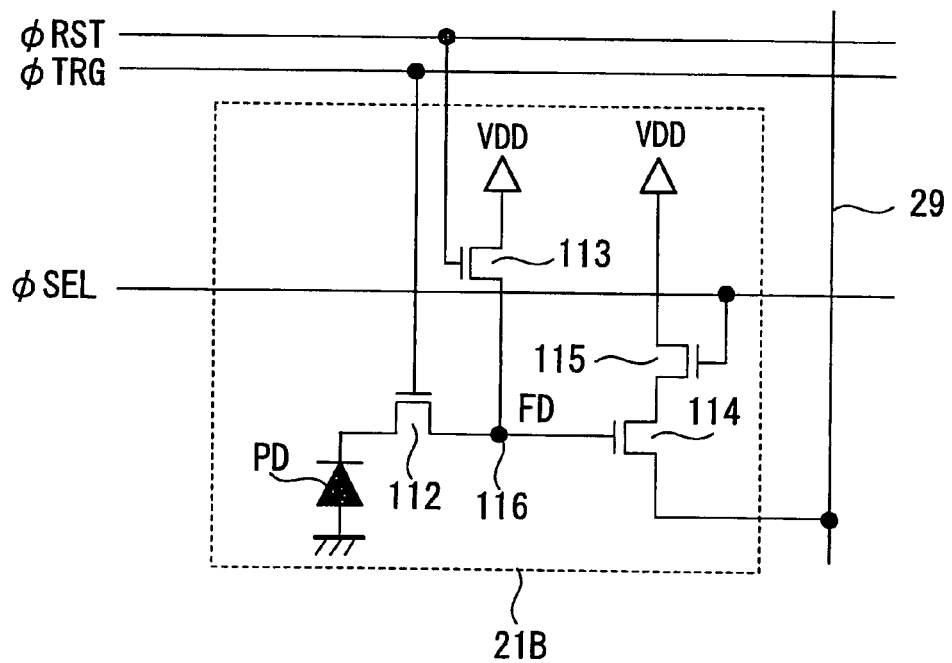
FIG. 5 is an equivalent circuit diagram showing another example of a single pixel according to the second embodiment of the present invention.

FIG. 5 is a circuit diagram showing another example of the circuit configuration of a single pixel 22. The signal pixel 22B according to this example circuit is formed so as to include a photoelectric conversion unit, such as the photodiode PD, and four pixel transistors. As one example, the four pixel transistors are the transfer transistor 112, the reset transistor 113, the amplification transistor 114, and a selection transistor 115. In this example also, n-channel MOS transistors may be used as the four pixel transistors 112 to 115.

The transfer transistor 112 is connected between the cathode of the photodiode PD and the FD unit 116. When photoelectric conversion is carried out by the photodiode PD, the signal charge (i.e., electrons) accumulated here can be transferred to the FD unit 116 by providing a transfer pulse φTRG to the gate of the transfer transistor 112.

The reset transistor 113 has a power supply VDD connected to the drain and the FD unit 116 connected to the source, and before the signal charge is transferred from the photodiode PD to the FD unit 116, the potential of the FD unit 116 can be reset by providing a reset pulse φRST to the gate of the reset transistor 113.

As one example, the selection transistor 115 has the power supply VDD connected to the drain and the drain of the amplification transistor 114 connected to the source. The selection transistor 115 is switched on when a selection pulse φSEL is provided to the gate and supplies the power supply VDD to the amplification transistor 114, thereby selecting the pixel 22B. Note that it is also possible to use a configuration where the selection transistor 115 is connected between the source of the amplification transistor 114 and the vertical signal line 29.

The amplification transistor 114 has a source follower configuration where the FD unit 116 is connected to the gate, the source of the selection transistor 115 is connected to the drain, and the vertical signal line 29 is connected to the source. The amplification transistor 114 outputs the potential of the FD unit 116 after resetting by the reset transistor 113 to the vertical signal line 29 as the reset level. In addition, the amplification transistor 114 outputs the potential of the FD unit 116 after the transfer of signal charge by the transfer transistor 112 to the vertical signal line 29 as the signal level.

Figure 6:
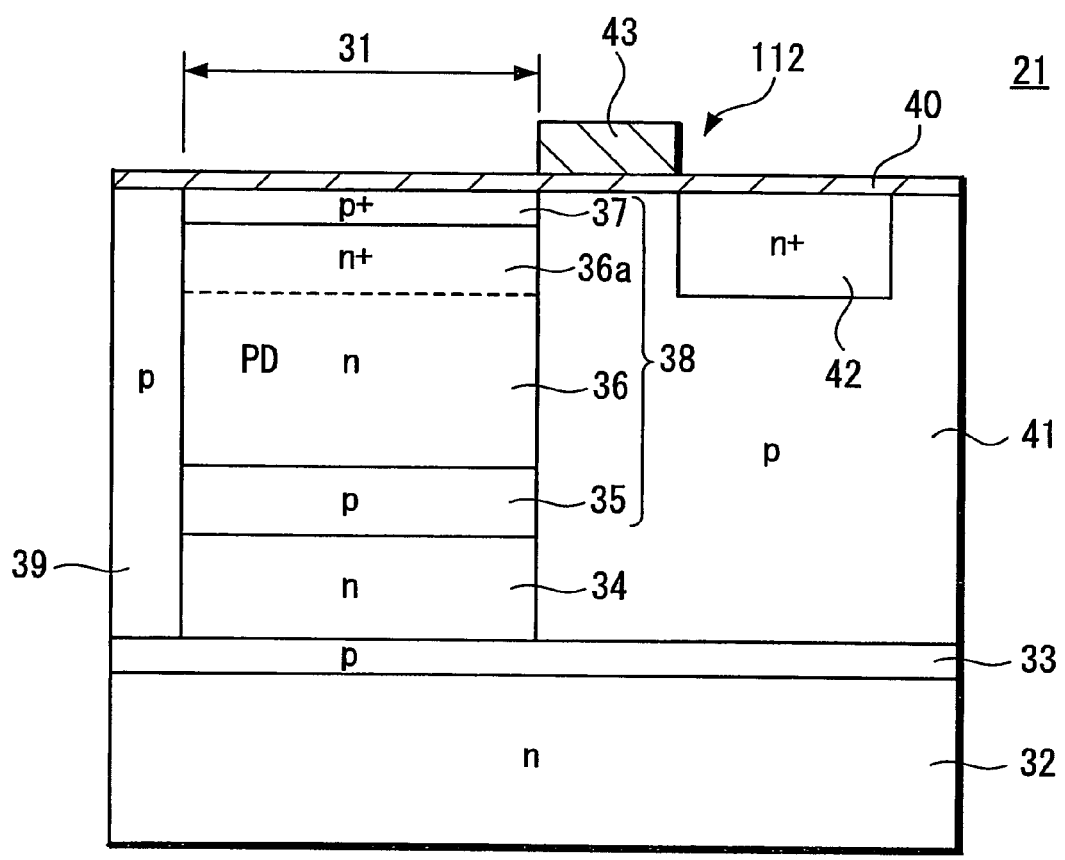
FIG. 6 is a cross-sectional view showing the principal part of the configuration of a pixel in a CMOS solid-state imaging device according to an embodiment of the present invention.

Also, in the solid-state imaging device 21 according to the present embodiment, as shown in FIG. 6, each light receiving region 31 that includes a photoelectric conversion unit that forms a pixel 22 is formed of the light receiving region 1 with the same configuration as that shown in FIG. 2 described earlier. Such light receiving region 31 corresponds to the first embodiment of a light receiving region of a solid-state imaging device according to the embodiment described earlier.

That is, each pixel 22 in the present embodiment is formed by forming a second conductivity type (for example, p-type) semiconductor well region 41 on a first conductivity type (for example, n-type) semiconductor substrate (for example, a silicon substrate) 32 and forming a plurality of pixel transistors Tr and a light receiving region 31 that includes a photoelectric conversion unit 38 such as a photodiode PD in the p-type semiconductor well region 41 that is partitioned by pixel separating regions 39 formed for example of p-type semiconductor regions.

The light receiving region 31 is formed by successively stacking a p-type semiconductor layer 33, an n-type semiconductor layer 34, a p-type semiconductor layer 35, an n-type semiconductor layer 36, and a p-type semiconductor layer (a so-called "p+ accumulation layer") 37 in contact with an n-type semiconductor substrate 32. The p-type semiconductor layer 37 near the surface of the light receiving region 31 where light is incident, the n-type semiconductor layer 36 therebelow having a charge accumulation region 36a with a high concentration, and the p-type semiconductor layer 35 therebelow form a photodiode PD that effectively forms the photoelectric conversion unit 38 and has an HAD configuration.

The n-type semiconductor layer 34 formed deep in the substrate is formed as a charge accumulating portion in which electrons (charge) are accumulated (hereinafter, this n-type semiconductor layer 34 is referred to as the "charge accumulating portion"). The p-type semiconductor layer that contacts the light-incident side (that is, the substrate surface-side in the present embodiment) of the charge accumulating portion 34 is a modulated potential barrier layer where a potential barrier $\phi a$ (see FIG. 1B) is modulated by holes h of the electron-hole pairs generated by photoelectric conversion. The p-type semiconductor layer 33 that contacts the opposite side of the charge accumulating portion 34 to the light-incident side, that is, the substrate depth side of the charge accumulating portion 34 in the present embodiment is a substrate-side potential barrier layer that has a fixed potential barrier $\phi b$ (see FIG. 1B).

In the same way as described earlier, in the state before light is received, the modulated potential barrier pa is set higher than the substrate-side potential barrier $\phi b$. In the state where light is received and photoelectric conversion is carried out, the modulated potential barrier $\phi a$ is modulated by the holes h and set lower than the substrate-side potential barrier $\phi b$. The respective potentials of the charge accumulating portion 34, the p-type semiconductor layer 35 that forms the modulated potential barrier $\phi a$, and the p-type semiconductor layer 33 that forms the substrate-side potential barrier $\phi b$ can be set by the impurity concentrations implanted therein.

The charge accumulating portion 34 and the p-type semiconductor layer 35 that forms the modulated potential barrier $\phi a$ are separately formed for each pixel. The p-type semiconductor layer 33 that forms the substrate-side potential barrier $\phi b$ that is fixed is formed so as to be shared by pixels.

In the same way as described earlier, faults 11 (see FIG. 1B) for generating electrons should preferably be formed deep in the substrate 2, that is, in a region in the vicinity of the charge accumulating portion 34 and the p-type semiconductor layer 33, for example. The electrons from such faults 11 are constantly accumulated in the charge accumulating portion 34. Note that even if the faults 11 are not provided, it is still possible for the charge accumulating portion 34 to accumulate electrons generated by photoelectric conversion of light with a long wavelength when light is received in a region in the vicinity of the charge accumulating portion 34 and the p-type semiconductor layer 33. In addition, it can be possible to have the charge accumulating portion 34 accumulate thermal electrons generated by heat.

On the other hand, the plurality of pixel transistors are formed in a p-type semiconductor well region 41. FIG. 6 shows only the transfer transistor 112 of the plurality of pixel transistors. The transfer transistor 112 is formed of the photodiode PD, an FD portion composed of an n-type semiconductor layer 42, and a gate electrode 43 formed with a gate insulating film 40 in between.

Note that although not shown in the drawings, multilayer interconnection is formed with interlayer insulating films in between above the n-type semiconductor substrate 32 in the imaging region, an on-chip color filter is formed thereupon with a smoothing film in between, and an on-chip microlens is then formed thereupon.

According to the CMOS solid-state imaging device 21 of the present embodiment, each pixel 22 is equipped in the thickness direction of the substrate 32 with a light receiving region 31 including the photoelectric conversion unit 38, the charge accumulating portion 34, and the modulated potential barrier $\phi a$ between the photoelectric conversion unit 38 and the charge accumulating portion 34. In each pixel 22, by using both the electrons and the holes of the electron-hole pairs generated by photoelectric conversion as the signal charge, as described earlier with reference to FIGS. 1A and 1B, it may be possible to improve the sensitivity of the solid-state imaging device. That is, the charge accumulating portion 34 is constantly filled with the electrons e' generated from the faults 11 in the substrate 32, for example. When light is received, of the electron-hole pairs generated by the photoelectric conversion by the photoelectric conversion unit 38, the electrons e that are used as signal charge are accumulated in the charge accumulation region 36a of the photoelectric conversion unit 38. At the same time, by having the holes h accumulate in the potential dip 13 (see FIG. 1B) of the p-type semiconductor layer 35, the modulated potential barrier $\phi a$ is modulated to become lower, so that the electrons e' in the charge accumulating portion 34 are supplied to the charge accumulation region 36a of the photoelectric conversion unit 38. Accordingly, the amount of signal charge is the sum of the electrons e and e', which improves sensitivity. In particular, the present embodiment can be preferably applied to a solid-state imaging device where the light-receiving area has been reduced due to the pixels 22 being made smaller.

In the embodiment described above where the light receiving region 1 shown in FIG. 1B is applied to the pixels 22 of the CMOS solid-state imaging device 21, the charge accumulating portion 34 and the modulated potential barrier $\phi a$ (i.e., the p-type semiconductor layer 35) are separately provided for each pixel. Each charge accumulating portion 34 is formed so as to be electrically floating. The substrate-side potential barrier $\phi b$ (i.e., the p-type semiconductor layer 33) is formed so as to be shared by every pixel. Also, since the substrate-side potential barrier $\phi b$ is formed deep in the substrate, the substrate-side potential barrier $\phi b$ is not affected by modulation of the gate potential, for example, at the substrate surface, which means that the barrier level thereof can be set by the impurity concentration of the p-type semiconductor layer 33. Aside from this, the barrier level of the substrate-side potential barrier $\phi b$ can be set by applying a predetermined potential, for example, 0V, to the semiconductor substrate 32. That is, the substrate-side potential barrier $\phi b$ of the charge accumulating portion 34 may be controlled by controlling the substrate potential. In this manner, the barrier level of the substrate-side potential barrier φb can be controlled and fixed more reliably.

In FIG. 6, as a countermeasure against blooming when an excessive signal charge has accumulated in the charge accumulation region 36a, it can be possible to supply charge via a transfer gate to the n-type semiconductor layer 42 that forms the FD portion.

The light receiving region of a pixel according to the embodiment can be formed of a variety of light receiving regions aside from the first embodiment shown in FIGS. 1A, 1B and FIG. 2 described above. Embodiments of other light receiving regions will now be described.

FIG. 7A shows a second embodiment of a light receiving region of a pixel. The light receiving region 51 according to the present embodiment is formed by forming a second conductive-type (that is, a p-type) semiconductor well region 14 on a first conductive-type (that is, an n-type) semiconductor substrate (for example, a silicon substrate) 2, a photodiode PD, for example, that forms a photoelectric conversion unit 8 in the p-type semiconductor well region 14, and a charge accumulating portion 16 in which electrons are accumulated and a p-type semiconductor layer 15 that forms a modulated potential barrier layer on the light-incident-side (that is, the substrate surface-side) of the photoelectric conversion unit 8. The p-type semiconductor layer (a so-called "p+ accumulation layer") 7 is formed on an uppermost surface of the semiconductor substrate 2.

An n-type charge accumulating portion 16 is formed so as to surround the p-type semiconductor layers 15 and 7. That is, the n-type charge accumulating portion 16 is formed inside the p-type semiconductor layer 15 provided in a central portion inside a charge accumulating region 6a on the substrate surface-side of the photoelectric conversion unit 8, and the surface of the n-type charge accumulating portion 16 is covered by the p-type semiconductor layer 7 that forms the p+ accumulation layer.

The photodiode PD that forms the photoelectric conversion unit 8 is formed of the p-type semiconductor well region 14, the n-type semiconductor layer 6 that includes the charge accumulating region 6a, the p-type semiconductor layers 15 that contact the n-type semiconductor layer 6, and the p-type semiconductor layer 7 that forms the p+ accumulation layer.

Although not shown in the drawings, it is preferable to form faults 11 that generate electrons to be accumulated in the n-type charge accumulating portion 16 in the periphery (that is, at the substrate surface) of the n-type charge accumulating portion 16. Note that even if faults 11 are not formed, it is still possible for the charge accumulating portion 16 to accumulate electrons generated by photoelectric conversion of light with a short wavelength when light is received in a region in the vicinity of the charge accumulating portion 16. In addition, it can be possible to have the charge accumulating portion 16 accumulate thermal electrons generated by heat.

The light receiving regions 51 that form pixels are formed of regions partitioned by pixel separating regions 9 (in the present embodiment, p-type semiconductor regions) formed on the semiconductor substrate 2. An insulating film 10 is formed of a silicon oxide film or the like on the entire surface that includes the light receiving regions 51.

Next, the operation of the light receiving regions 51 according to the second embodiment will be described. As shown in the potential distribution in FIG. 7B, the electrons generated from the faults 11, or electrons of the electron-hole pairs generated by the photoelectric conversion of the incident light of a short wavelength, or thermal electrons generated in the substrate surface (in the present embodiment, the electrons e' generated from the faults) are accumulated in the potential dip (i.e., a potential dip for electrons) 12 of the charge accumulating portion 16 so that the potential dip 12 is constantly filled with the electrons e'.

When light is incident, the electrons e of the electron-hole pairs, which are generated by the photoelectric conversion by the photodiode PD that forms the photoelectric conversion unit 8 and form the signal charge, are accumulated in the n-type charge accumulating region 6a where the impurity concentration is high. At the same time, the holes h of the electron-hole pairs generated by the photoelectric conversion are accumulated in the potential dip (a potential dip for holes) 13 of the p-type semiconductor layer 15, thereby modulating and lowering the modulated potential barrier φa.

This means that some of the electrons e' that are accumulated in the charge accumulating portion 16 skip over the modulated potential barrier φa and are supplied to the charge accumulating region 6a of the photoelectric conversion unit 8. In the photoelectric conversion unit 8, the electrons e' from the charge accumulating portion 16 are added to the electrons e generated by photoelectric conversion, thereby increasing the amount of signal charge.

According to the light receiving region 51 of a pixel according to the second embodiment, in the same way as the first embodiment, by adding the electrons e' supplied by the holes h to the electrons e of the electron-hole pairs generated by the photoelectric conversion, it can be possible to improve sensitivity even when the light-receiving area is reduced due to the pixel area being made smaller. Since the charge accumulating portion 16 is formed on the substrate surface side of the light receiving region 51, it can be possible to improve the sensitivity for light of a blue wavelength in particular.

In the embodiment shown in FIG. 7A, part of the charge accumulating portion 16 can be formed so as to be exposed to the substrate surface, that is, to be exposed to the outside. It is also possible to form an electrode on the charge accumulating portion 16 that is partly exposed via an opening in the insulating film 10, and to apply a predetermined voltage, in this example, 0V, via this electrode to produce a source for supplying the electrons e' to the charge accumulating portion 16. It is also possible to control the barrier level of the modulated potential barrier φa using the voltage applied to this electrode. In addition, it is also possible to expose part of the charge accumulating portion 16 to beyond the insulating film 10 and to supply the electrons e' from this exposed portion to the charge accumulating portion 16.

FIG. 8A shows a third embodiment of a light receiving region of a pixel according to the embodiment. A light receiving region 52 according to the present embodiment is formed by forming a p-type semiconductor layer 15 in contact with an n-type charge accumulating region 6a with a high impurity concentration on the surface side of the n-type semiconductor layer 6 of the photoelectric conversion unit 8 and forming the charge accumulating portion 16 of an n-type semiconductor layer in the center of the p-type semiconductor layer 15. The surfaces of the p-type semiconductor layer 15 and the charge accumulating portion 16 are formed so that an interface faces the insulating film 10 on the substrate.

In this light receiving region 52, since the upper surface of the n-type charge accumulating portion 16 is in contact with the insulating film 10, electrons from the interface with the insulating film 10 are constantly accumulated in the charge accumulating portion 16. Since the remaining parts of the configuration are the same as in FIG. 7A, corresponding parts have been assigned the same reference numerals and duplicated description thereof is omitted.

In the light receiving region 52 according to the third embodiment, as shown by the potential distribution in FIG. 8B, electrons e' from the interface with the insulating film 10 are constantly accumulated in the potential dip (that is, a potential dip for electrons) 12 of the n-type charge accumulating portion 16 on the light-incident side, that is the substrate surface side of the photoelectric conversion unit 8. The electrons e' that overflow from the potential dip 12 are discharged from the substrate surface (i.e., the interface with the insulating film 10).

When light is received, in the same way as described earlier, the electrons e of the electron-hole pairs, which are generated by the photoelectric conversion by the photodiode PD that is the photoelectric conversion unit 8, and form the signal charge, are accumulated in the n-type charge accumulating region 6a where the impurity concentration is high. At the same time, the holes h of the electron-hole pairs generated by the photoelectric conversion are accumulated in the potential dip (i.e., a potential dip for holes) 13 of the p-type semiconductor layer 15, so that the modulated potential barrier φa is modulated and becomes lower. Some of the electrons e' that are accumulated in the charge accumulating portion 16 skip over the modulated potential barrier φa and are supplied to the charge accumulating region 6a of the photoelectric conversion unit 8. In the photoelectric conversion unit 8, the electrons e' from the charge accumulating portion 16 are added to the electrons e generated by the photoelectric conversion, thereby increasing the signal charge.

According to the light receiving region 52 of the third embodiment, in the same way as the first embodiment, by adding the electrons e' supplied by the holes h to the electrons e of the electron-hole pairs generated by the photoelectric conversion, it can be possible to improve the sensitivity even when the light receiving area is reduced due to the pixel area being made smaller. Since the charge accumulating portion 16 is formed at the substrate surface-side of the light receiving region 52, the sensitivity for light of a blue wavelength in particular is improved. The light receiving region 52 is also easy to manufacture.

Figure 9:
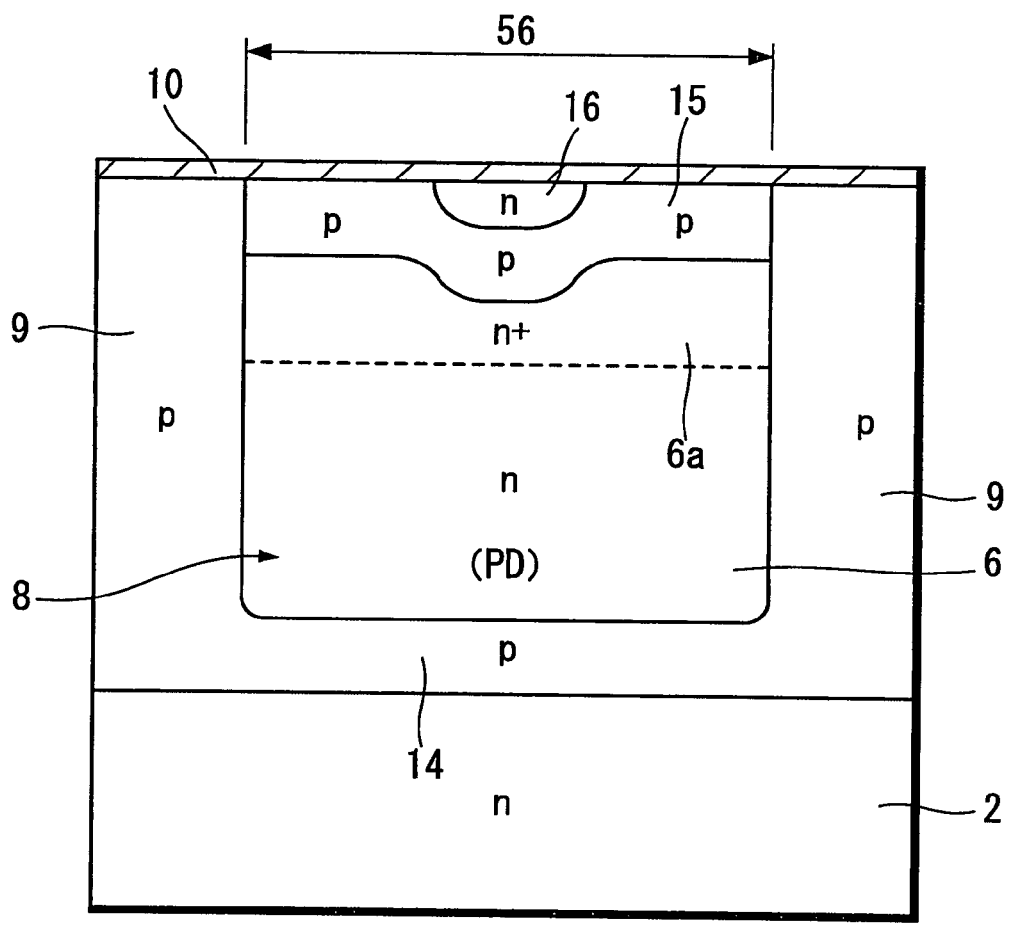
FIG. 9 is a schematic diagram showing a fourth embodiment of a light receiving region of a pixel of a solid-state imaging device according to the embodiment.

FIG. 9 shows a fourth embodiment of a light receiving region of a pixel according to the embodiment. The light receiving region 56 according to the present embodiment is formed by forming a p-type semiconductor layer 15 on the substrate surface and then forming an n-type charge accumulating portion 16 by ion implantation of n-type dopant in part of the substrate surface. Due to the diffusion and forming of this n-type charge accumulating portion 16, the part of the p-type semiconductor layer 15 that corresponds to the charge accumulating portion 16 becomes depressed downward.

In this light receiving region 56, since the upper surface of the n-type charge accumulating portion 16 contacts the insulating film 10, electrons from the interface with the insulating film 10 are constantly accumulated in the charge accumulating portion 16. Since the remaining parts of the configuration are the same as in FIG. 8A, corresponding parts have been assigned the same reference numerals and duplicated description thereof is omitted.

The light receiving region 56 according to the fourth embodiment has the same effect as the third embodiment shown in FIG. 8. That is, by adding electrons e' supplied from the holes h to the electrons e of the electron-hole pairs generated by the photoelectric conversion, it can be possible to improve sensitivity even when the light-receiving area is reduced due to the pixel area being made smaller. Since the charge accumulating portion 16 is formed on the substrate surface side of the light receiving region 52, it can be possible to improve the sensitivity for light of a blue wavelength in particular. The light receiving region 53 is also easy to manufacture.

Figure 10:
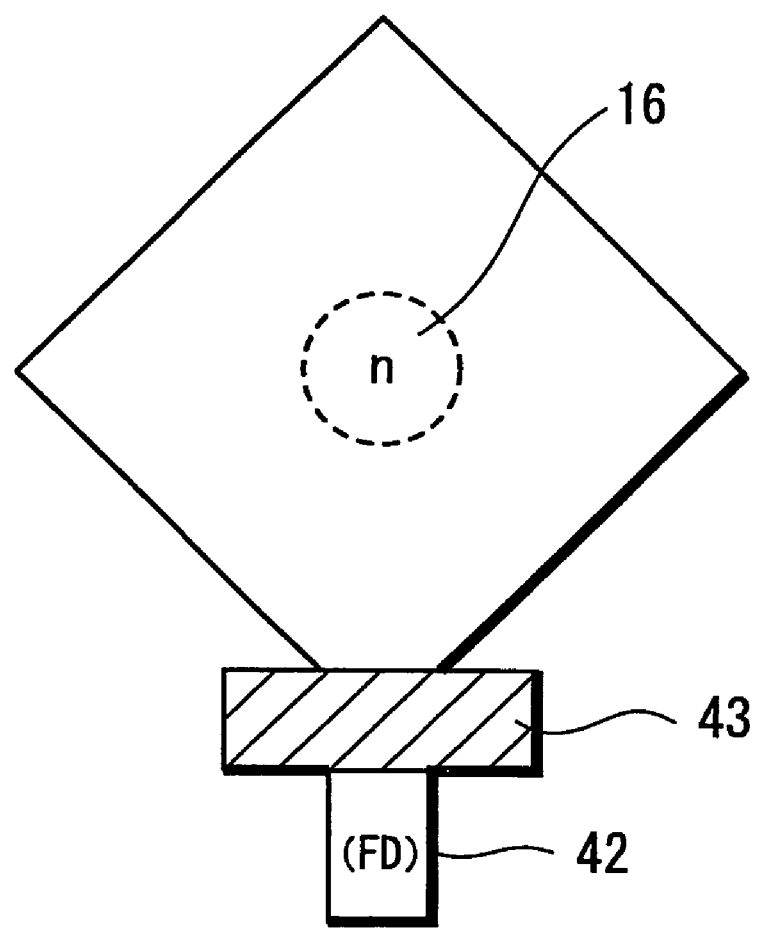
FIG. 10 is a plan view for a case where the light receiving region shown in FIG. 8A or FIG. 9 has been applied to a CMOS solid-state imaging device.

Note that when the light receiving regions 52, 56 shown in FIG. 8A and FIG. 9 are applied to the light receiving regions of a CMOS solid-state imaging device, it is preferable to use the configuration shown in the top view in FIG. 10.

That is, when the n-type charge accumulating portion 16 is formed in a center portion of the light receiving regions 52, 56, the n-type semiconductor layer 42 that forms the FD portion is disposed at a position away from the charge accumulating portion 16. When the light receiving regions 52, 56 are formed rectangular, for example, and the n-type semiconductor layer 42 may be disposed facing a position where a corner portion of the rectangular region has been cut away and the gate electrode 43 of the transfer transistor is formed between the part where the corner of the rectangular region has been cut away and the FD portion.

Figure 11:
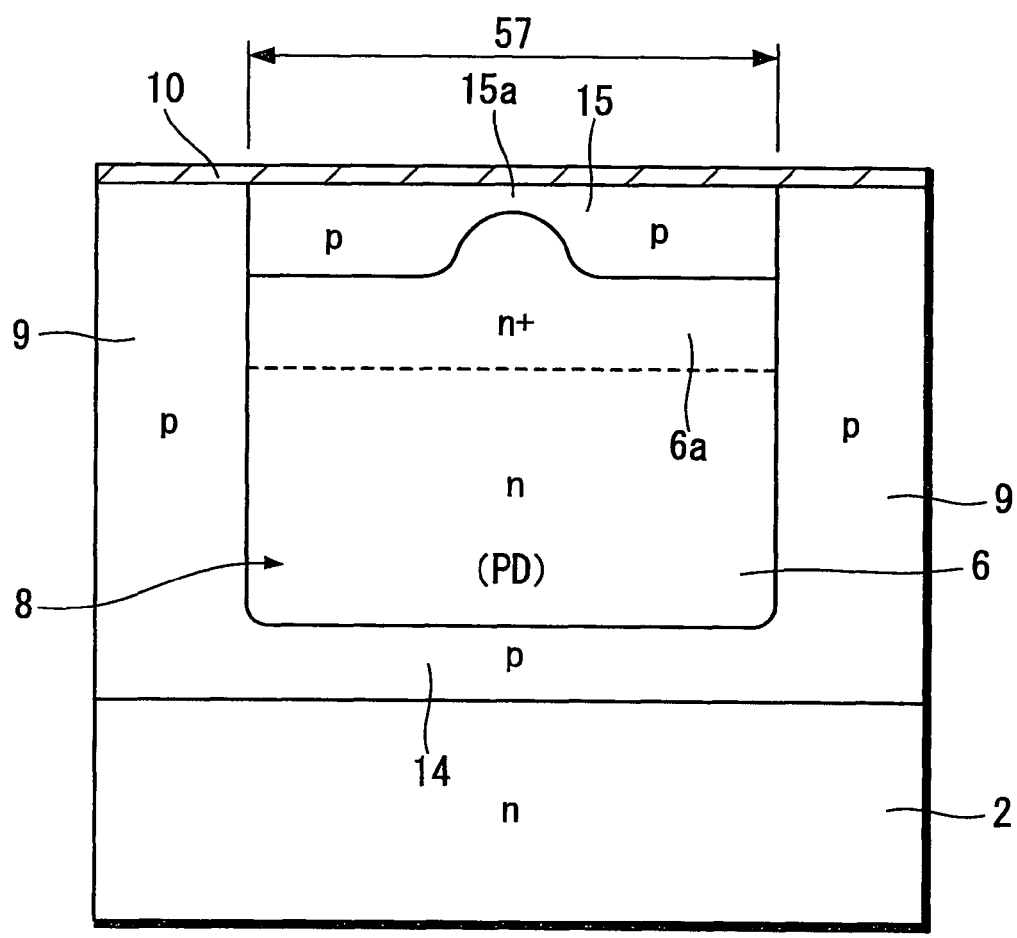
FIG. 11 is a schematic diagram showing a fifth embodiment of a light receiving region of a pixel of a solid-state imaging device according to the embodiment.

FIG. 11 shows a fifth embodiment of a light receiving region of a pixel. A light receiving region 57 according to the present embodiment is formed by omitting the n-type charge accumulating portion 16 and thinly forming part of the p-type semiconductor layer 15 at the substrate surface. In this case, the substrate surface is the source for supplying electrons and a p-type semiconductor portion 15a where the substrate surface is thin is used as the modulated potential barrier layer. Since the remaining parts of the configuration are the same as in FIG. 8A, corresponding parts have been assigned the same reference numerals and duplicated description thereof is omitted.

In the light receiving region 57 according to the fifth embodiment, electrons e' are supplied from the substrate surface to the charge accumulating portion 16 where the electrons e' are accumulated. The electrons e of the electron-hole pairs generated by photoelectric conversion at the photoelectric conversion unit 8 are accumulated in the n-type charge accumulating region 6a. On the other hand, holes enter the potential dip of the p-type semiconductor portion 15a to modulate the substrate-side potential barrier φb. Accordingly, the electrons e' from an electron supplying portion of the substrate surface are supplied to the charge accumulating region 6a of the photoelectric conversion unit 8, thereby increasing the amount of signal charge of the charge accumulating region 6a.

According to the light receiving region 57 according to the fifth embodiment, in the same way as described earlier, the electrons e' supplied from the holes h are added to the electrons e of the electron-hole pairs generated by the photoelectric conversion, so that it can be possible to improve the sensitivity even when the light receiving area is reduced due to the pixel area being made smaller. Since the charge accumulating portion 16 is formed at the substrate surface of the light receiving region 57, the sensitivity for light of a blue wavelength in particular is improved.

FIG. 12A shows a sixth embodiment of a light receiving region according to the embodiment. A light receiving region 53 according to the present embodiment is formed by forming the p-type semiconductor layer 15 in contact with the n-type charge accumulating region 6a where the impurity concentration is high on the surface-side of the n-type semiconductor layer 6 of the photoelectric conversion unit 8 and forming the charge accumulating portion 16 of an n-type semiconductor layer on the entire surface of the p-type semiconductor layer 15. The surface of the n-type charge accumulating portion 16 is formed so that the n-type charge accumulating portion 16 faces the interface with the insulating film 10 on the substrate.

In this light receiving region 53, since the upper surface of the n-type charge accumulating portion 16 contacts the insulating film 10, electrons from the interface with the insulating film 10 are constantly accumulated in the charge accumulating portion 16. Since the remaining parts of the configuration are the same as in FIG. 7A, corresponding parts have been assigned the same reference numerals and duplicated description thereof is omitted.

In this light receiving region 53 according to the sixth embodiment, as shown in the potential distribution in FIG. 12B, in the same way as in the third embodiment, electrons e' from the interface with the insulating film 10 are constantly accumulated in the potential dip (a potential dip for electrons) 12 in the n-type charge accumulating portion 16 on the light-incident side, that is, the substrate surface side, of the photoelectric conversion unit 8. The electrons e' that overflow from the potential dip 12 are discharged from the substrate surface (i.e., the interface with the insulating film 10).

When light is received, in the same way as in the third embodiment, the electrons e of the electron-hole pairs, which are generated by the photoelectric conversion by the photodiode PD (that is, the photoelectric conversion unit 8) and form the signal charge, are accumulated in the n-type charge accumulating region 6a where the impurity concentration is high. At the same time, the holes h of the electron-hole pairs generated by the photoelectric conversion are accumulated in the potential dip (a potential dip for holes) 13 of the p-type semiconductor layer 15, thereby modulating and lowering the modulated potential barrier φa. Some of the electrons e' accumulated in the charge accumulating portion 16 skip over the modulated potential barrier φa and are supplied to the charge accumulating region 6a of the photoelectric conversion unit 8. In the photoelectric conversion unit 8, the electrons e' from the charge accumulating portion 16 are added to the electrons e that have been generated by the photoelectric conversion to increase the amount of signal charge.

According to the light receiving region 53 according to the sixth embodiment, in the same way as the third embodiment, by adding the electrons e' supplied from the holes h to the electrons e of the electron-hole pairs generated by photoelectric conversion, it can be possible to improve the sensitivity even when the light-receiving area is reduced due to the pixel area being made smaller. Since the charge accumulating portion 16 is formed at the substrate surface of the light receiving region 53, the sensitivity for light of a blue wavelength in particular is improved. The light receiving region 53 is also easy to manufacture.

Figure 13B:
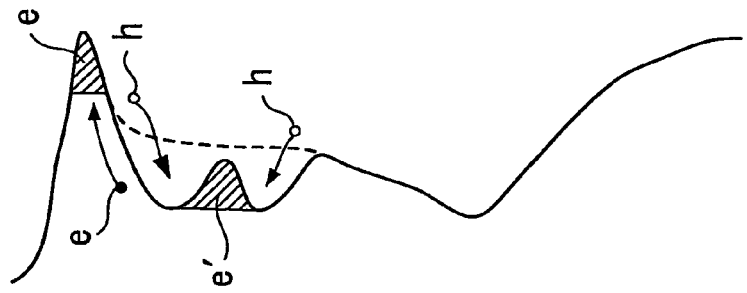
FIGS. 13A and 13B are schematic diagrams showing a seventh embodiment of a light receiving region of a pixel of a solid-state imaging device according to the embodiment and a potential distribution thereof.
Figure 13A:
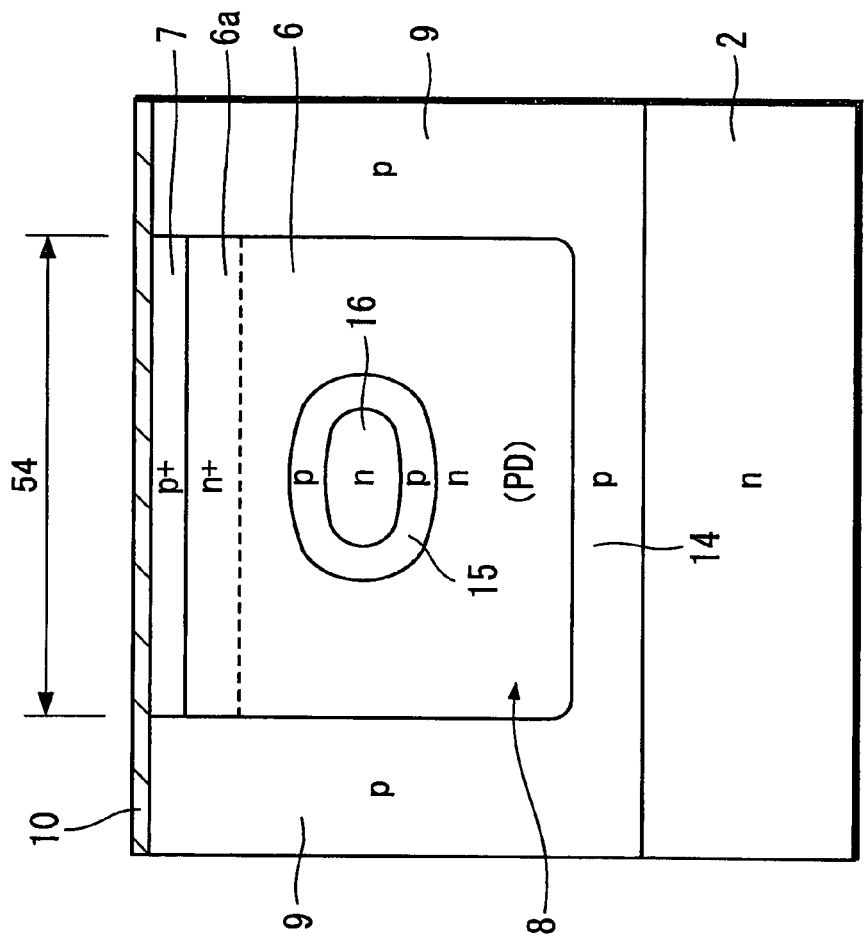

FIG. 13A shows a seventh embodiment of a light receiving region. A light receiving region 54 according to the present embodiment is formed by forming the n-type charge accumulating portion 16 that is locally surrounded by the p-type semiconductor layer 15 at a central position in the thickness of the semiconductor substrate 2, that is, inside the n-type semiconductor layer 6 of the photoelectric conversion unit 8. The p-type semiconductor layer (the so-called "p+ accumulation layer") 7 is formed on the surface side of the n-type semiconductor layer 6 and the insulating film 10 is formed on the p-type semiconductor layer 7.

Although not shown, faults for generating electrons to be accumulated in the charge accumulating portion 16 should preferably be formed in a region in the vicinity of the n-type charge accumulating portion 16. Note that even if the faults are not provided, it is still possible for the charge accumulating portion 16 to accumulate electrons generated by photoelectric conversion of light with a short wavelength when light is received in a region in the vicinity of the charge accumulating portion 16. In addition, it can be possible to have the charge accumulating portion 16 accumulate thermal electrons generated by heat. Since the remaining parts of the configuration are the same as in FIG. 7A, corresponding parts have been assigned the same reference numerals and duplicated description thereof is omitted.

In the seventh embodiment, as shown by the potential distribution in FIG. 13B, the electrons from the faults, the electrons of the electron-hole pairs generated by photoelectric conversion when light of the short wavelength is incident, or thermal electrons generated in the substrate surface (in the present embodiment, electrons e' generated from faults) are accumulated in the potential dip (a potential dip for electrons) 12 of the charge accumulating portion 16. The potential dip 12 is constantly filled with the electrons e'.

When light is received, the electrons e of the electron-hole pairs, which are generated by photoelectric conversion at the photodiode PD (that is, the photoelectric conversion unit 8) and are form the signal charge, are accumulated in the n-type charge accumulating region 6a where the impurity concentration is high. At the same time, the holes h of the electron-hole pairs generated by the photoelectric conversion are accumulated in the potential dip (a potential dip for holes) 13 of the p-type semiconductor layer 15 to modulate and lower the modulated potential barrier φa. Some of the electrons e' accumulated in the charge accumulating portion 16 skip over the modulated potential barrier φa and are supplied to the charge accumulating region 6a of the photoelectric conversion unit 8. In the photoelectric conversion unit 8, the electrons e' from the charge accumulating portion 16 are added to the electrons e generated by the photoelectric conversion to increase the amount of signal charge.

According to the light receiving region 54 of a pixel according to the seventh embodiment, by adding the electrons e' supplied from the holes h to the electrons e of the electron-hole pairs generated by the photoelectric conversion, it can be possible to improve the sensitivity even when the light-receiving area is reduced due to the pixel area being made smaller. Since the charge accumulating portion 16 is formed in a central part in the thickness direction of the light receiving region 54, the sensitivity for light of a green wavelength in particular is improved.

FIG. 14A shows an eighth embodiment of a light receiving region of a pixel according to the embodiment. The light receiving region 55 of a pixel according to the present embodiment is formed so as to include the n-type charge accumulating portion 4 deep in the substrate as shown in FIG. 2 described earlier and the n-type charge accumulating portion 16 at the substrate surface as shown in FIG. 7. That is, the light receiving region 55 is formed by forming the p-type semiconductor layers 15 and 4 on both the light-incident side and the opposite side, that is, both the substrate surface side and the substrate depth side of the n-type semiconductor layer 6 (of the photoelectric conversion unit 8) that includes the n-type charge accumulating region 6a where the impurity concentration is high. The charge accumulating portion 16 on the substrate surface side is locally formed on the p-type semiconductor layer 15 formed on the n-type charge accumulating region 6a of the photoelectric conversion unit 8. The p-type semiconductor layer 7 (a so-called "p+ accumulation layer) is formed on the uppermost surface of the substrate, and the insulating film 10 is formed thereupon.

Although not shown, faults should preferably be formed in a region in the vicinity of the charge accumulating portion 4 deep in the substrate and in a vicinity of the n-type charge accumulating portion 16 at the substrate surface. Note that even if the faults are not formed, it is still possible for the charge accumulating portions 16 and 4 to accumulate electrons generated by photoelectric conversion of light with a short wavelength and light with a long wavelength when light is received in the regions in the vicinity of the charge accumulating portions 16 and 4. In addition, it can be possible to have the charge accumulating portions 16 and 4 accumulate thermal electrons generated by heat. Since the remaining parts of the configuration are the same as in FIG. 2 and FIG. 7A, corresponding parts have been assigned the same reference numerals and duplicated description thereof is omitted.

In the light receiving region 55 of a pixel according to the eighth embodiment, in the same way as described earlier, electrons e' are constantly accumulated in the charge accumulating portions 4 and 16. When light is received, the electrons e of the electron-hole pairs, which are generated by the photoelectric conversion at the photodiode PD (that is, the photoelectric conversion unit 8) and form the signal charge, are accumulated in the n-type charge accumulating region 6a where the impurity concentration is high. At the same time, the holes h of the electron-hole pairs generated by the photoelectric conversion at the center of the substrate and deep in the substrate are accumulated in the potential dip (a potential dip for holes) 13 in the p-type semiconductor layer 5 to modulate and lower the modulated potential barrier $\phi$a. The holes h of the electron-hole pairs generated by the photoelectric conversion at the substrate surface are accumulated in the potential dip (a potential dip for the holes) 13 in the p-type semiconductor layer 15 to modulate and lower the modulated potential barrier $\phi$a. By doing so, some of the electrons e' accumulated in the charge accumulating portions 4 and 16 respectively skip over the modulated potential barriers $\phi$a modulated by the p-type semiconductor layers 5, 15 and are supplied to the charge accumulating region 6a of the photoelectric conversion unit 8. In the photoelectric conversion unit 8, the electrons e' from the charge accumulating portions 4, 16 are added to the electrons e generated by the photoelectric conversion, thereby increasing the amount of signal charge.

In the light receiving region 55, the electrons e' of the charge accumulating portion 4 deep in the substrate are supplied to the photoelectric conversion unit 8 when light of mainly red and green wavelengths is incident and the electrons e' of the charge accumulating portion 16 at the substrate surface are supplied to the photoelectric conversion unit 8 when light of mainly a blue wavelength is incident.

According to the light receiving region 55 of a pixel according to the eighth embodiment, by adding the electrons e' supplied by the holes h to the electrons e of the electron-hole pairs generated by photoelectric conversion, it can be possible to improve the sensitivity even when the light-receiving area is reduced due to the pixel area being made smaller. Since charge accumulating portions 16 are formed both deep in the substrate and at the substrate surface of the light receiving region 55, the sensitivity for light of red, green, and blue wavelengths in particular is improved.

The light receiving regions 51 to 57 according to the second to eighth embodiments shown in FIGS. 7A to 14A can be applied to the light receiving region of a pixel 2 of the CMOS solid-state imaging device 21 described earlier. That is, the CMOS solid-state imaging device 21 according to the embodiment shown in FIG. 6 can be formed by replacing the light receiving region 31 thereof with any of the light receiving regions 51 to 57 shown in FIG. 7A to FIG. 14A.

On the other hand, in a CMOS solid-state imaging device 21 according to the embodiment where the light receiving region shown in FIG. 1 is used, if the electrons e' accumulated in the charge accumulating portion 34 are reset at the same time as the resetting of the signal charge (i.e., electrons e) of the photodiode PD (that is, the photoelectric conversion unit 8) and electrons e' are again accumulated in the charge accumulating portion 34 during the period where light is received, it will be possible to improve the saturation signal charge (Qs) and increase the dynamic range (i.e., the number of tones). This embodiment is shown in FIGS. 15A and 15B.

FIG. 15B shows the potential distribution of a light receiving region with the same configuration as the light receiving region 31 in the CMOS solid-state imaging device shown in FIG. 6. The potential distribution shown by the solid line indicates the state where the modulated potential barrier $\phi$a has been modulated to $\phi$a' by the holes h generated by the photoelectric conversion. A voltage such as 0V or 1.8V is applied to the n-type semiconductor substrate 32 to set the substrate-side potential barrier $\phi$b.

If during resetting, 2.7V for example, is applied to the n-type semiconductor substrate 32 at the same time as when the signal charge e+e' accumulated in the charge accumulating region 6a of the photoelectric conversion unit 8 is reset, as shown by the broken line, the substrate-side potential barrier $\phi$b is eliminated and all of the electrons e' of the charge accumulating portion 34 are discharged toward the n-type semiconductor substrate 32. After this, the substrate potential of the semiconductor substrate 32 is restored to 0V or 1.8V to form the substrate-side potential barrier $\phi$b.

By using this configuration, the saturation charge (Qs) of the photoelectric conversion unit 8 increases due to the addition of the amount of charge accumulated in the charge accumulating portion 34. Accordingly, the sensitivity is improved and the saturation charge (Qs) can also be increased.

Next, one embodiment of a method of manufacturing the CMOS solid-state imaging device 21 that has the pixels 22 including the light receiving region 31 shown in FIG. 6 will be described with reference to FIG. 16A to FIG. 17E. The method of manufacturing according to the present embodiment uses part of a method of manufacturing suited to manufacturing small pixels (such method is described later). Note that to simplify the description, FIG. 16A to FIG. 17E are schematic diagrams that show only the light receiving regions and the pixel separating regions and omit the pixel transistors.

Figure 16A:
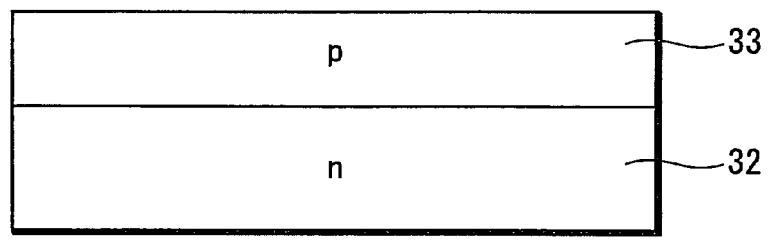
FIGS. 16A to 16C are diagrams showing a series of manufacturing steps in a first example of a method of manufacturing a solid-state imaging device according to the embodiment shown in FIG. 6.

First, as shown in FIG. 16A, the p-type semiconductor layer 33 that becomes the substrate-side potential barrier layer after ion implantation is formed on the surface of the n-type semiconductor substrate 32.

Figure 16B:
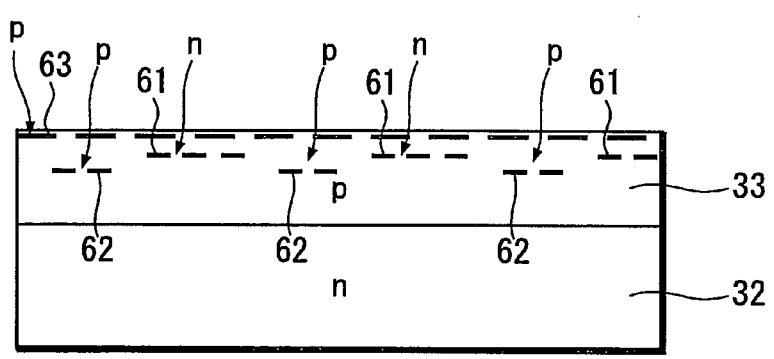

Next, as shown in FIG. 16B, ion implanting of an n-type dopant 61 for forming the charge accumulating portion 34, a p-type dopant 62 for forming the pixel separating regions 39, and a p-type dopant 63 for forming the p-type semiconductor layer 35 that forms the modulated potential barrier layer is selectively carried out on the surface of the p-type semiconductor layer 33. Accordingly, the various dopants 61, 62, 63 are selected according to the respective diffusion coefficients thereof.

Figure 16C:
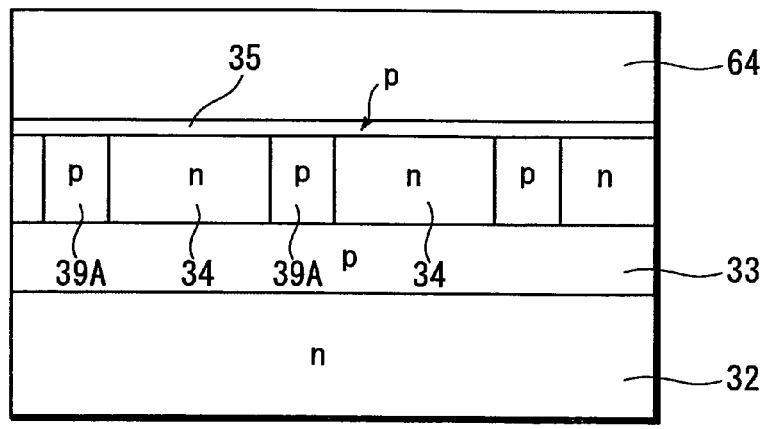

Next, as shown in FIG. 16C, an epitaxial layer 64 is grown on the p-type semiconductor layer 33. At the same time as this epitaxial growth, the various dopants 61, 62, 63 are diffused in the epitaxial layer 64 to form the charge accumulating portion 34, lower pixel separating regions 39A that form part of the pixel separating regions 39, and the p-type semiconductor layer 35.

Figure 17D:
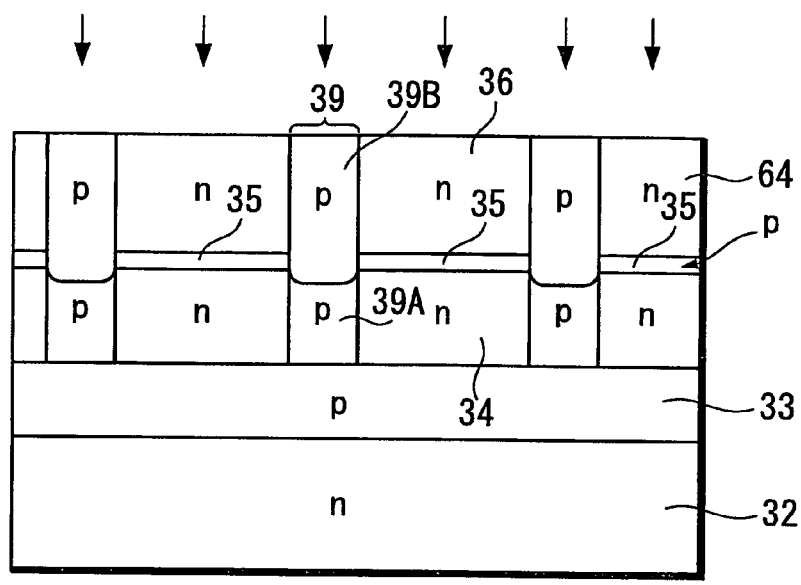
FIGS. 17D and 17E are diagrams showing further manufacturing steps in the first example of a method of manufacturing a solid-state imaging device according to the embodiment shown in FIG. 6.

Next, as shown in FIG. 17D, ions of the p-type dopant and n-type dopant are selectively implanted from the upper surface of the epitaxial layer 64, and heat treatment is carried out to form the upper pixel separating regions 39B that reach the lower pixel separating regions 39A and the n-type semiconductor layer 36 including the charge accumulation regions 36a that form the photoelectric conversion units 8 in contact with the p-type semiconductor layer 35 at positions corresponding to the respective charge accumulating portions 34. The lower pixel separating regions 39A and the upper pixel separating regions 39B form the pixel separating regions 39. At the same time, the p-type semiconductor layer 35 that forms the modulated potential barrier layer and the n-type semiconductor layer 36 that forms the photoelectric conversion units 8 are formed at the pixel positions separated by the pixel separating regions.

Figure 17E:
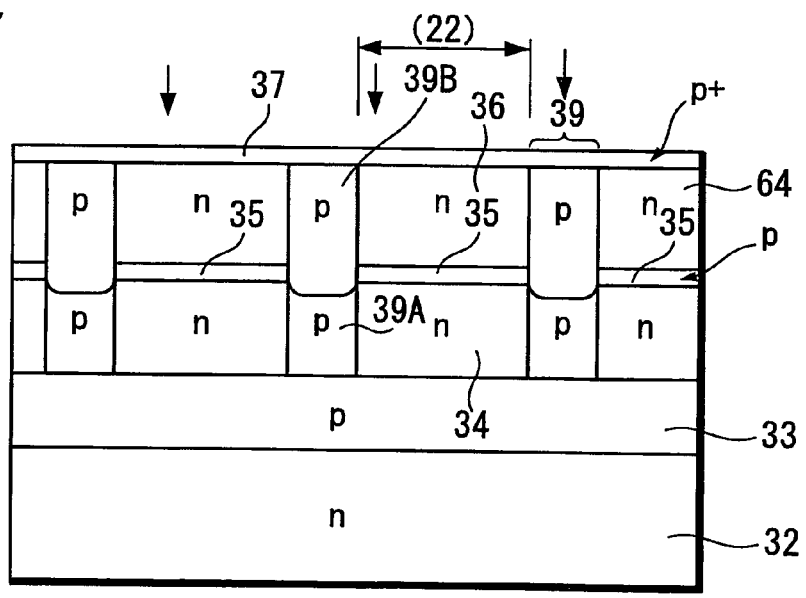

Next, as shown in FIG. 17E, a p-type semiconductor layer 37 that forms the p+ accumulation layer is formed on the surface of the epitaxial layer 64. In this way, the light receiving region 31 is formed for each pixel. After this, the pixel transistors, the multilayer interconnection, the on-chip color filters, the on-chip lenses, and the like are formed to obtain the CMOS solid-state imaging device.

By controlling the concentration of the p-type impurity in a region of the n-type semiconductor layer (that is, the charge accumulating portion 34) that contacts the p-type semiconductor layer 33 and a region of the n-type semiconductor layer 36 of the photoelectric conversion unit 38 that contacts the p-type semiconductor layer 35, it may be possible to cancel out the n-type concentration using the p-type impurity and lower the concentration (see the concentration distribution in FIG. 1A). This impurity concentration distribution of the semiconductor layers can be achieved by selecting the impurities according to the diffusion coefficients thereof and controlling the dose during ion implantation and the range distance Rp for the ion implantation.

If the light receiving region is reduced due to the pixels being made smaller, there will be an increase in the aspect ratio of the resist mask and it may become difficult to form a multilayer structure where n-type semiconductor layers and p-type semiconductor layers are stacked one on top of the other in the thickness direction by ion implantation from the upper surface. In the method of manufacturing according to the present embodiment shown in FIG. 16A to FIG. 17E, ion implantation is carried out in advance for the n-type dopant 61 and the p-type dopant 62, 63 on the surface of the p-type semiconductor layer 33 formed on the n-type semiconductor substrate 32 and the dopants are diffused into the epitaxial layer 64 from below at the same time as the epitaxial growth to form the charge accumulating portions 34, the pixel separating regions 39A, and the p-type semiconductor layer 35. After this, ion implantation of the n-type dopant and the p-type dopant is selectively carried out from the surface of the epitaxial layer 64 and a heat treatment is carried out to form the pixel separating regions 39B, the n-type semiconductor layer 36 of the photoelectric conversion unit 8, and the p-type semiconductor layer 37. Accordingly, it may be possible to reduce the implantation energy for ion implantation from the upper surface of the epitaxial layer and to reliably form a multilayer structure in which the n-type semiconductor layers and p-type semiconductor layers are stacked one on top of the other.

In addition, to increase the depth of the photoelectric conversion unit 8, or to reduce the implantation energy for implanting ions from the upper surface, as shown in FIG. 15A, it may be possible to repeatedly carry out a process where ions of the n-type dopant and p-type dopant are implanted into the base semiconductor layer and epitaxial growth is carried out.

Figure 18A:
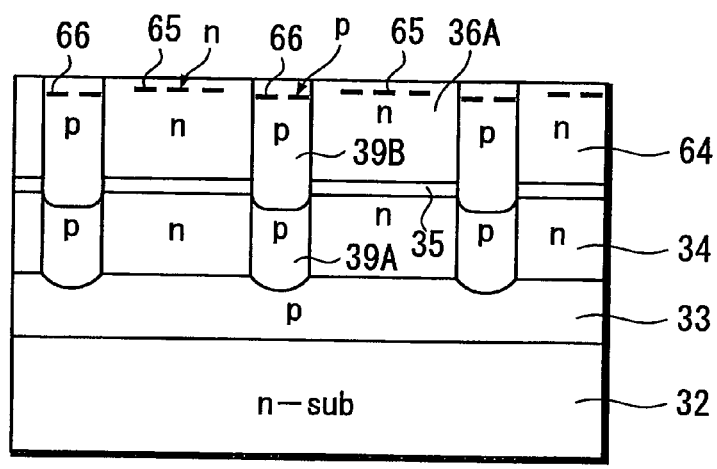
FIGS. 18A to 18C are diagrams showing a series of manufacturing steps in another example of a method of manufacturing a solid-state imaging device according to the embodiment shown in FIG. 6.

That is, after the process in FIG. 17D, as shown in FIG. 18A, ion implantation is carried out for the n-type dopant 65 and the p-type dopant 66 on the surfaces of the n-type semiconductor region 36A and the pixel separating regions 39B of the first epitaxial layer 64.

Figure 18B:
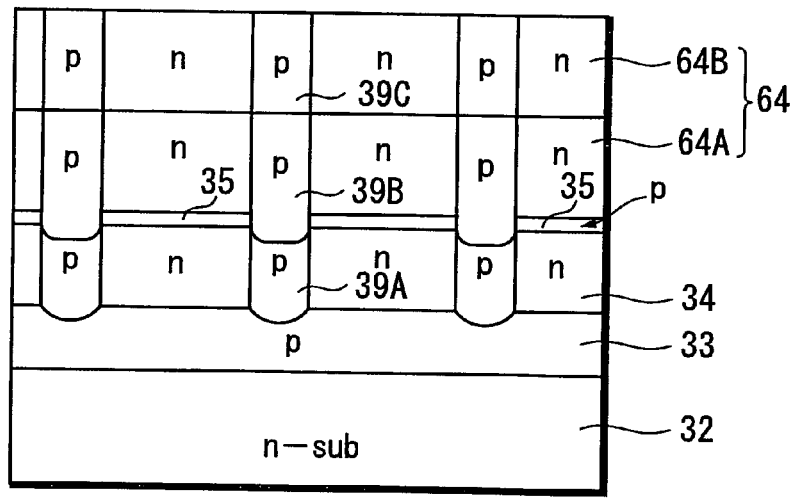

Next, as shown in FIG. 18B, the second epitaxial layer 67 is grown, and the n-type semiconductor layer 36B and the p-type pixel separating regions 39C are formed in the second epitaxial layer 67 so as to be respectively continuous with the n-type semiconductor layer 36A and the pixel separating regions 39B in the first epitaxial layer 64.

Figure 18C:
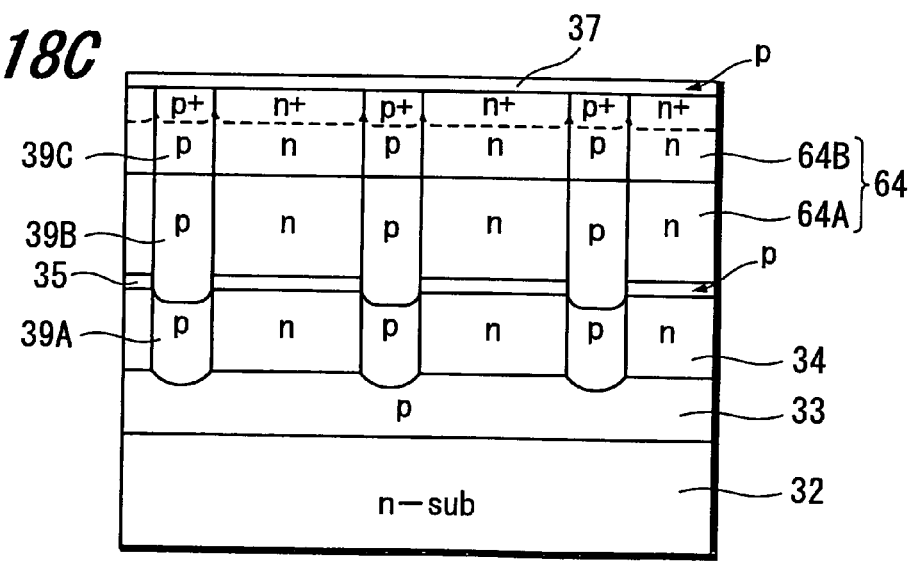

After this, as shown in FIG. 18C, the p-type semiconductor layer 37 that forms the p+ accumulation layer is formed by ion implantation on the surface of the second epitaxial layer 67.

According to the method of manufacturing a CMOS solid-state imaging device according to the present embodiment, it can be possible to form a semiconductor layer with a certain concentration profile deep in the semiconductor substrate. It is also possible to form faults deep in the substrate. Accordingly, it can be possible to manufacture a CMOS solid-state imaging device of the present embodiment with small pixels and a multilayer semiconductor structure.

Although an n-type semiconductor substrate is used as the substrate in the CMOS solid-state imaging devices and the method of manufacturing according to the respective embodiments described earlier, it is also possible to use a p-type semiconductor substrate. Also, although a substrate where a p-type well region is formed in an n-type semiconductor substrate has been used, it is also possible to use a substrate where a p-type well region is formed in a p-type semiconductor substrate.

Although the light receiving regions according to the respective embodiments described above are applied to a surface-incident CMOS solid-state imaging device where light is incident on the substrate surface side that has multilayer interconnection, it is also possible to apply the embodiment of the invention to a rear-surface-incident CMOS solid-state imaging device where light is incident on the substrate rear surface side that is the opposite side to the multilayer interconnection. When the light receiving regions of the respective embodiments described above are applied to a rear-surface-incident CMOS solid-state imaging device, a configuration is used where the n-type semiconductor substrate 2 on the rear surface side in each of the embodiments is omitted.

Figure 19:
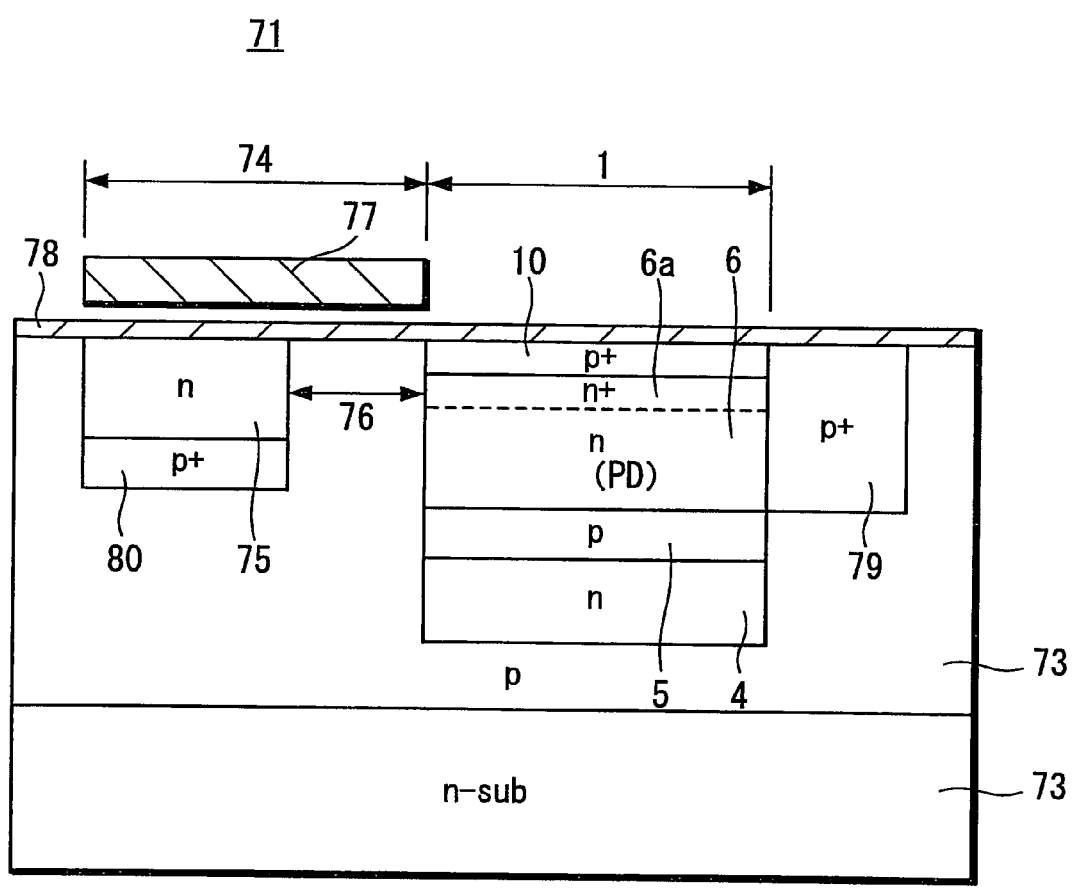
FIG. 19 is a cross-sectional view of a principal part of a pixel of a CCD solid-state imaging device according to an embodiment of the present invention.

The light receiving regions 1, and 51 to 57 of a pixel according to the first to eighth embodiments described earlier can also be applied to the light receiving region of a CCD solid-state imaging device (i.e., image sensor). FIG. 19 shows the principal part of an embodiment of the present invention that has been applied to a CCD solid-state imaging device.

A CCD solid-state imaging device 71 according to the present embodiment is formed of a plurality of light receiving regions arranged in a matrix in the imaging region and vertical transfer registers with a CCD configuration that correspond to the respective columns of the imaging regions. In an imaging region, as shown in FIG. 19, a semiconductor well region 73 of a second conductivity type (in this example, p-type) is formed on a semiconductor substrate 72 of a first conductivity type (in this example, n-type), and as one example the light receiving region 1 according to the first embodiment and an n-type transfer channel region 75 of a vertical transfer register 74 are formed in this p-type semiconductor well region 73.

The light receiving region 1 is formed so as to include the n-type charge accumulating portion 4, the p-type semiconductor layer 5 that forms the modulated potential barrier $\phi a$, the n-type semiconductor layer 6 that forms the photoelectric conversion unit 8 and has the charge accumulating region 6*a* where the impurity concentration is high at the surface side thereof, and the p-type semiconductor layer (p+ accumulation layer) 10 in the p-type semiconductor well region 73. A transfer electrode 77 is formed via a gate insulating film 78 to cover a read region 76 on the n-type transfer channel region 75. On the opposite side of the light receiving region 1 to the read region 76, a p-type channel stop region 79 is formed to separate the pixels. In addition, a p-type semiconductor well region 80 is formed below the n-type transfer channel region 75.

Note that although not shown in the drawing, a light-blocking film is formed via an interlayer insulating film across the entire surface aside from the light receiving region and an on-chip color filter and an on-chip microlens are also stacked via a smoothing film.

In this CCD solid-state imaging device 71, the p-type semiconductor well region 73 is an overflow control region and is formed as a vertical overflow drain to discharge excess charge toward the substrate 72. The p-type semiconductor well region 73 is formed as the fixed substrate-side potential barrier $\phi b$ described earlier.

In the CCD solid-state imaging device 71 according to the present embodiment also, as described earlier, electrons e' from the faults formed deep in the substrate, for example, are constantly accumulated in the n-type charge accumulating portion 4. When light is received, of the electron-hole pairs generated by the photoelectric conversion by the photodiode PD (that is, the photoelectric conversion unit), the electrons e that form the signal charge are accumulated in the charge accumulating region 6a, and at the same time, the modulated potential barrier pa of the p-type semiconductor layer 5 is modulated by the holes so that some of the electrons e' of the n-type charge accumulating portion 4 are supplied to the charge accumulating region 6a of the photodiode PD. Accordingly, even if the pixel area is reduced in size, it may be still possible to increase the amount of signal charge that accumulates in the charge accumulating region 6a and thereby improve the sensitivity.

In the CCD solid-state imaging device, the substrate potential of the semiconductor substrate 72 is controlled to produce an electronic shutter or the like. Accordingly, if the signal charge e+e' of the photodiode PD is read out via the read region 76 to the vertical transfer register 74, and at the same time, the substrate potential is controlled to reset the electrons e' of the charge accumulating portion 4, it will be possible to increase the saturation charge (Qs) of the photodiode PD.

Next, a method of manufacturing a photoelectric conversion unit and a pixel separating region that construct a pixel in particular out of a solid-state imaging device will be described. In this solid-state imaging device such as a CMOS image sensor or a CCD image sensor, there is a tendency for the aspect ratio of the photodiode that is the photoelectric conversion unit to increase as pixels are made smaller. When such photodiodes with an increased aspect ratio are formed by implanting ions from the substrate surface side, the aspect ratio (i.e., the ratio of the thickness to the openings) of the resist mask increases, which may make it difficult to form the resist mask. The acceleration voltage for ion implantation also increases. When ions are implanted at a deep position, the ion implantation region becomes broad. When deep ion implantation is carried out for the pixel separating regions, the ion implantation regions also become broad. This means that it may be difficult to correctly form the photodiodes as far as deep positions. In addition, since the pixel separating regions between the photodiodes also become narrow, it may also be difficult to form the pixel separating regions.

Figure 20A:
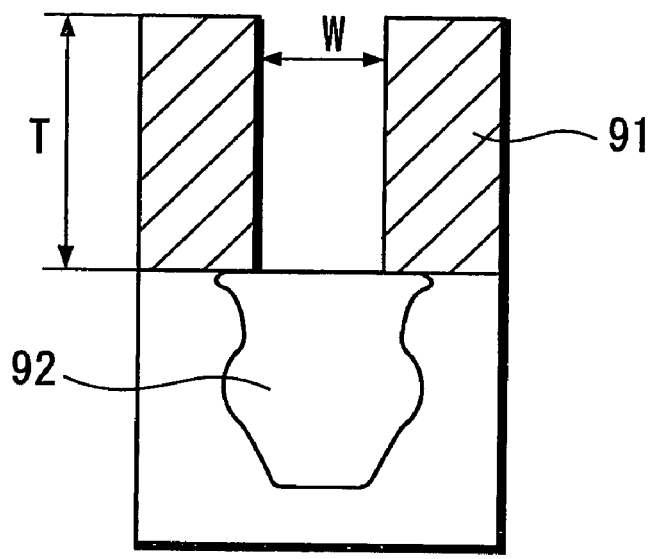
FIGS. 20A and 20B are schematic diagrams useful in explaining the present invention.
Figure 20B:
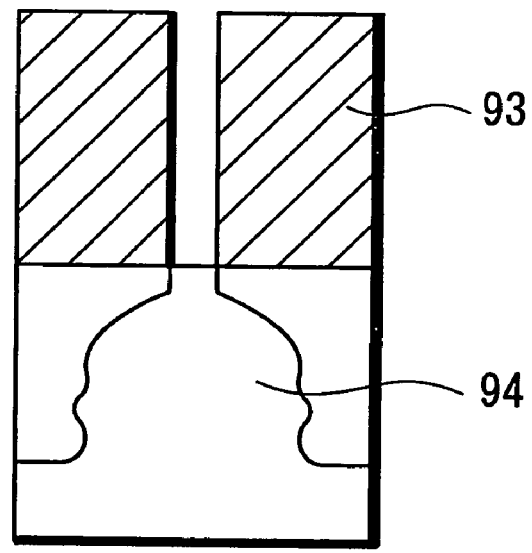

FIGS. 20A and 20B show the state of the photodiodes and pixel separating regions in a case where the pixels have been made smaller. For the photodiodes, when the aspect ratio (the ratio of thickness T:opening width W) of the resist mask 91 is set at 10.5:1, for example, the form of the diffused layer 92 of the photodiodes formed by ion implantation is an undesirable shape as shown in FIG. 20A. Also, for the pixel separating regions, when the aspect ratio (the ratio of thickness T:opening width W) of the resist mask 93 is set at 21:1, for example, the form of the pixel separating regions 94 formed by ion implantation is an undesirable shape as shown in FIG. 20B.

Figure 21A:
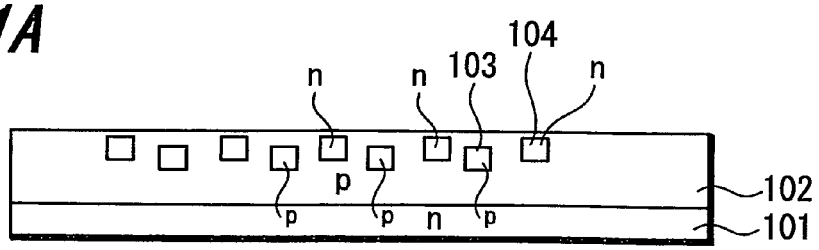
FIGS. 21A to 21D show one example of a method of manufacturing a solid-state imaging device to which the present invention has been applied.

Next, an improved method of manufacturing will be described with reference to FIGS. 21A to 21D. As shown in FIG. 21A, a p-type semiconductor well region 102 is formed on an n-type or p-type (in the present embodiment, n-type) silicon semiconductor substrate 101, and ion implantation is carried out for a p-type dopant 103 that forms pixel separating regions in the p-type semiconductor well region 102 and an n-type dopant 104 that forms an n-type semiconductor layer of the photodiode. In view of the differences in the diffusion coefficients, the depth of the range distance Rp for these dopants 102, 103, 104 may be changed. Note that a p-type silicon substrate can be used as the substrate 101 and a substrate produced by forming p-type semiconductor well regions 102 in this p-type silicon substrate 101 can be used.

Figure 21B:
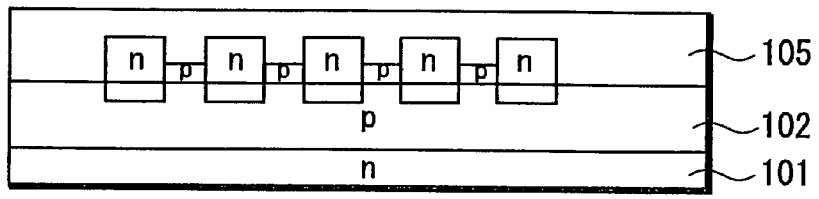

Next, as shown in FIG. 21B, an epitaxial layer 105 is grown on the p-type semiconductor well region 102. The n-type dopant 104 and the p-type dopant 103 may be diffused by solid solution diffusion in the epitaxial layer 105 during epitaxial growth.

Figure 21C:
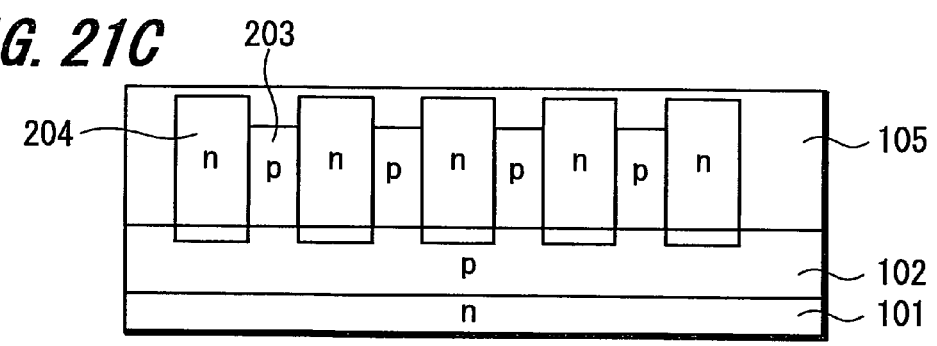

Next, as shown in FIG. 21C, the growth of the epitaxial layer 105 is completed. At this time, the solid solution diffusion of the n-type dopant 104 and the solid solution diffusion of the p-type dopant 103 will extend or not extend to the interface of the epitaxial layer 105 depending on the ion implantation conditions of the dopants 104, 103. Accordingly, n-type semiconductor layers 204 of photodiodes and p-type pixel separating regions 203 are formed.

Figure 21D:
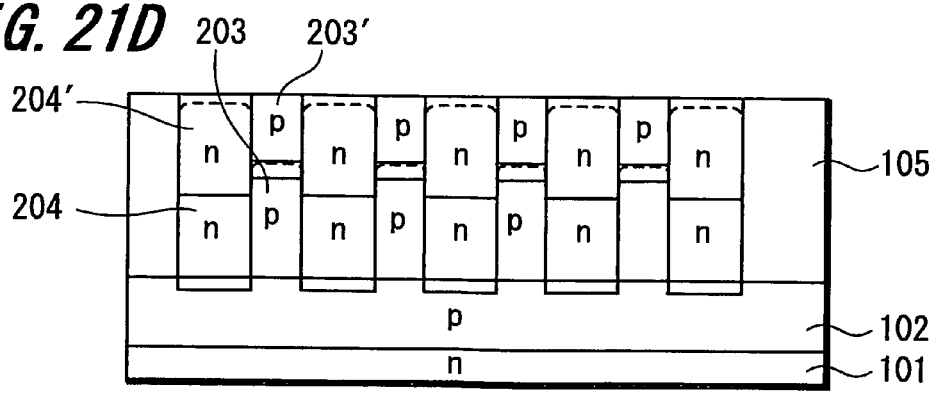

Next, as shown in FIG. 21D, after the epitaxial growth, ion implantation from the upper surface of the epitaxial layer 105 is replenished to form n-type semiconductor layers 204' on the n-type semiconductor layers 204 and p-type semiconductor layers 203' on the p-type pixel separating regions 203. Note that the replenishing of ion implantation in the photodiodes from the upper surface of the epitaxial layer is preferably be carried out after the gate electrodes of the pixel transistors have been formed, for example.

After the epitaxial growth, annealing is carried out. Here, solid solution diffusion of the dopants is carried out with the epitaxial growth temperature and the hydrogen annealing temperature at around 1000° C.

According to the method of manufacturing described above, ion implantation of dopants for forming photodiodes and pixel separating regions is carried out in advance in the p-type semiconductor well region 102 of the semiconductor substrate 101 before the epitaxial growth, and after the epitaxial growth, annealing is carried out to diffuse the dopants in the epitaxial layer. The accumulation of the epitaxial layer, the ion implantation of the dopants, and the accumulation of the epitaxial layer are repeated, and by replenishing the ion implantation from the upper layer of the final epitaxial layer, it can be possible to carry out ion implantation with the required aspect ratio and to form the photodiodes and pixel separating regions even for small pixels.

Since the photodiodes are formed by solid solution diffusion with an accumulation temperature of the epitaxial layer and a hydrogen annealing temperature of around 1000° C., it can be possible to reduce the number of times ion implantation is carried out and to reduce the generation of white spots due to implantation damage. When the ion implantation is replenished from the upper surface of the epitaxial layer, it can be possible to reduce the thickness of the resist mask, an amount of energy for driving ions into the vicinity of the surface is sufficient as the acceleration energy of ion implantation, and the aspect ratio of the replenished diffusion region is reduced.

Since it can be possible to carry out low energy acceleration for sensor (i.e., photodiode) implantation, it can be possible to form small pixels. Since the sensor is not formed by ion implantation only, it can be possible to reduce the number of implantation faults and to form a sensor with a low number of extremely small white spots.

In the embodiments described above, a configuration is used where of the electron-hole pairs generated by photoelectric conversion, the electrons are accumulated as signal charge in the photoelectric conversion unit, the charge accumulated in the charge accumulating portion is set as electrons, and the modulated potential barrier is modulated by the holes of the electron-hole pairs. However, as an alternative, it can be possible to use a configuration where of the electron-hole pairs generated by photoelectric conversion, the holes are set as signal charge, the charge accumulated in the charge accumulating portion is set as holes, and the modulated potential barrier is modulated by the electrons of the electron-hole pairs. In such case, for the light receiving regions according to the various embodiments described earlier, it can be possible to use configurations where the conductive types of the respective semiconductor layers are reversed.

Figure 22:
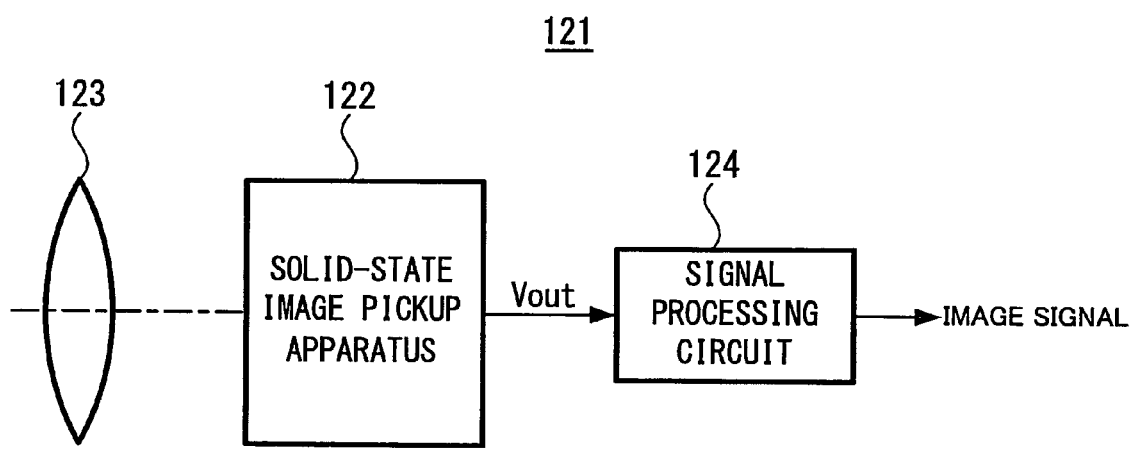
FIG. 22 is a schematic diagram showing an embodiment of a camera according to the embodiment.

FIG. 22 shows the overall configuration of a camera that is equipped with the solid-state imaging device according to the embodiment described above. According to the embodiment of the invention, a camera 121 includes a solid-state imaging device 122 (that is, the CMOS solid-state imaging device 21, the CCD solid-state imaging device 71, or a solid-state imaging device equipped with a light receiving region according to one of the other embodiments), an optical system 123, and a signal processing circuit 124.

The optical system 123 receives light from the subject (i.e., incident light) and is allowed to form an image an imaging surface of the solid-state imaging device 122. Thus, in the imaging region of each pixel in the solid-state imaging device 122, signal charge (electrons e+e') in keeping with the incident amount of light is accumulated in the photoelectric conversion unit.

The signal processing circuit 124 carries out various signal processing on the output signal of the solid-state imaging device 122 and outputs the result as an image signal.

According to the camera equipped with the solid-state imaging device according to the present embodiment, it can be possible to realize a high-sensitivity camera even when the pixels are made smaller. It is also possible to realize a camera with an improved dynamic range.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising for each pixel:
   a photoelectric conversion unit;
   a charge accumulating portion; and
   a potential barrier provided between the photoelectric conversion unit and the charge accumulating portion, in a thickness direction of a substrate, wherein
   when light is received, a first charge derived from one of electron-hole pairs generated by photoelectric conversion is accumulated in the photoelectric conversion unit as signal charge, and
   the potential barrier is modulated by a second charge derived from the other of the electron-hole pairs so that the first charge that has accumulated in the charge accumulating portion is supplied to the photoelectric conversion unit.

2. A solid-state imaging device according to claim 1, wherein
   the photoelectric conversion unit is disposed closer to a side where light is incident than the charge accumulating portion and the charge accumulating portion is formed deep in the substrate when looking from the side where light is incident.

3. A solid-state imaging device according to claim 1, wherein
   the photoelectric conversion unit is formed closer to a side where light is incident than the charge accumulating portion and the charge accumulating portion is formed at an intermediate position in the thickness direction of the substrate.

4. A solid-state imaging device according to claim 1, wherein
   the charge accumulating portion is formed closer to a side where light is incident than the photoelectric conversion unit.

5. A solid-state imaging device according to claim 1, wherein
   the charge accumulating portion is formed on both a side where light is incident and an opposite side with the photoelectric conversion unit in between.

6. A solid-state imaging device according to claim 1, wherein
   the photoelectric conversion unit is formed closer to a side where light is incident than the charge accumulating portion and a potential barrier on an opposite side of the charge accumulating portion to the side where light is incident is fixed.

7. A solid-state imaging device according to claim 6, wherein
   the potential barrier on an opposite side of the charge accumulating portion to the side where light is incident is formed so as to be shared by every pixel.

8. A solid-state imaging device according to claim 1, wherein
   the photoelectric conversion unit is formed closer to a side where light is incident than the charge accumulating portion and a potential barrier on an opposite side of the charge accumulating portion to the side where light is incident is controlled by controlling a potential of the substrate.

9. A solid-state imaging device according to claim 1, wherein
   the charge accumulated in the charge accumulating portion is simultaneously reset when the signal charge accumulated in the photoelectric conversion unit is reset.

10. A method of manufacturing a solid-state imaging device comprising the steps of:
    implanting first ions of predetermined dopants into a surface of a semiconductor region before epitaxial growth;
    accumulating an epitaxial growth layer on the surface of the semiconductor region and diffusing the predetermined dopants in the epitaxial growth layer; and
    implanting second ions of predetermined dopants from a surface of the epitaxial growth layer, to form pixel separating portions, a photoelectric conversion unit that uses a first charge derived from one of electron-hole pairs generated by photoelectric conversion as signal charge, a charge accumulating portion in which the first charge is accumulated, and a potential barrier layer that is provided between the photoelectric conversion unit and the charge accumulating portion and is modulated by a second charge derived from one of the electron-hole pairs generated by the photoelectric conversion.

11. A camera comprising:
a solid-state imaging device;
an optical system that guides incident light to an imaging unit of the solid-state imaging device; and
a signal processing circuit that processes an output signal of the solid-state imaging device, wherein
the solid-state imaging device includes for every pixel:
a photoelectric conversion unit;
a charge accumulating portion; and
a potential barrier provided between the photoelectric conversion unit and the charge accumulating portion, in a thickness direction of a substrate, wherein
when light is received, a first charge derived from one of electron-hole pairs generated by photoelectric conversion is accumulated in the photoelectric conversion unit as signal charge, and
the potential barrier is modulated by a second charge derived from the other of the electron-hole pairs so that the first charge that has accumulated in the charge accumulating portion is supplied to the photoelectric conversion unit.

* * * * *